(12) United States Patent
Sawa et al.

(10) Patent No.: US 10,910,401 B2
(45) Date of Patent: Feb. 2, 2021

(54) SEMICONDUCTOR DEVICE AND METHOD OF MANUFACTURING THE SAME

(71) Applicant: TOSHIBA MEMORY CORPORATION, Minato-ku (JP)

(72) Inventors: Keiichi Sawa, Yokkaichi (JP); Kazuhiro Matsuo, Kuwana (JP); Kazuhisa Matsuda, Yokkaichi (JP); Hiroyuki Yamashita, Yokkaichi (JP); Yuta Saito, Yokkaichi (JP); Shinji Mori, Nagoya (JP); Masayuki Tanaka, Yokkaichi (JP); Kenichiro Toratani, Kuwana (JP); Atsushi Takahashi, Yokkaichi (JP); Shouji Honda, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/559,165

(22) Filed: Sep. 3, 2019

(65) Prior Publication Data

US 2020/0295035 A1   Sep. 17, 2020

(30) Foreign Application Priority Data

Mar. 15, 2019  (JP) .................................. 2019-048973

(51) Int. Cl.
*H01L 27/11582* (2017.01)
*H01L 29/792* (2006.01)
(Continued)

(52) U.S. Cl.
CPC .. *H01L 27/11582* (2013.01); *H01L 27/11519* (2013.01); *H01L 27/11578* (2013.01); *H01L 27/1157* (2013.01); *H01L 29/7926* (2013.01)

(58) Field of Classification Search
CPC ............. H01L 27/11582; H01L 23/528; H01L 27/11519; H01L 29/649; H01L 29/66825;
(Continued)

(56) References Cited

U.S. PATENT DOCUMENTS 7,842,992 B2   11/2010  Yamazaki et al.
8,013,380 B2   9/2011  Nakasaki et al.
(Continued)

FOREIGN PATENT DOCUMENTS

JP   2007-250582 A   9/2007
JP   2007-294910 A   11/2007
(Continued)

*Primary Examiner* — Thinh T Nguyen
(74) *Attorney, Agent, or Firm* — Oblon, McClelland, Maier & Neustadt, L.L.P.

(57) ABSTRACT

In one embodiment, a semiconductor device includes a substrate, insulating films and first films alternately stacked on the substrate, at least one of the first films including an electrode layer and a charge storage layer provided on a face of the electrode layer via a first insulator, and a semiconductor layer provided on a face of the charge storage layer via a second insulator. The device further includes at least one of a first portion including nitrogen and provided between the first insulator and the charge storage layer with an air gap provided in the first insulator, a second portion including nitrogen, provided between the charge storage layer and the second insulator, and including a portion protruding toward the charge storage layer, and a third portion including nitrogen and provided between the second insulator and the semiconductor layer with an air gap provided in the first insulator.

20 Claims, 30 Drawing Sheets

(51) Int. Cl.
*H01L 27/11578* (2017.01)
*H01L 27/11519* (2017.01)
*H01L 27/1157* (2017.01)

(58) Field of Classification Search
CPC .......... H01L 29/7926; H01L 27/11578; H01L 27/1157
USPC ........ 257/314, 315, 316, 324; 438/201, 211, 438/257
See application file for complete search history.

(56) References Cited

U.S. PATENT DOCUMENTS

| | | | |
|---|---|---|---|
| 8,072,024 B2 | 12/2011 | Ishikawa et al. | |
| 8,134,200 B2 | 3/2012 | Yaegashi | |
| 8,338,876 B2 | 12/2012 | Kito et al. | |
| 8,354,706 B2 | 1/2013 | Kanemura et al. | |
| 8,455,940 B2 | 6/2013 | Lee et al. | |
| 8,779,499 B2 | 7/2014 | Kiyotoshi | |
| 8,809,931 B2 | 8/2014 | Nakai et al. | |
| 8,829,593 B2 | 9/2014 | Sekine et al. | |
| 8,866,139 B2 | 10/2014 | Ino | |
| 9,012,971 B2 | 4/2015 | Seo et al. | |
| 9,129,861 B2 | 9/2015 | Seol et al. | |
| 9,257,572 B2 | 2/2016 | Seol et al. | |
| 9,287,388 B2 | 3/2016 | Sawa | |
| 10,153,262 B2 | 12/2018 | Isogai et al. | |
| 10,242,992 B2 | 3/2019 | Sakamoto et al. | |
| 10,276,586 B2 | 4/2019 | Murakoshi et al. | |
| 10,283,646 B2 | 5/2019 | Sawa et al. | |
| 2006/0264066 A1 | 11/2006 | Bartholomew et al. | |
| 2011/0287612 A1* | 11/2011 | Lee et al. | H01L 27/11565 257/324 |
| 2015/0060992 A1 | 3/2015 | Taekyung et al. | |
| 2015/0200199 A1 | 7/2015 | Sakamoto et al. | |
| 2016/0043099 A1 | 2/2016 | Purayath et al. | |
| 2017/0263640 A1 | 9/2017 | Takashima et al. | |
| 2017/0263780 A1 | 9/2017 | Sawa et al. | |
| 2018/0269196 A1 | 9/2018 | Isogai et al. | |
| 2020/0091165 A1 | 3/2020 | Yamashita et al. | |

FOREIGN PATENT DOCUMENTS

| | | |
|---|---|---|
| JP | 2008-47283 A | 2/2008 |
| JP | 2008-536318 A | 9/2008 |
| JP | 2009-81203 A | 4/2009 |
| JP | 2009-152498 A | 7/2009 |
| JP | 2009-277770 A | 11/2009 |
| JP | 2010-147125 A | 7/2010 |
| JP | 2010-225684 A | 10/2010 |
| JP | 2010-258388 A | 11/2010 |
| JP | 2011-114057 A | 6/2011 |
| JP | 2012-227326 A | 11/2012 |
| JP | 2013-197546 A | 9/2013 |
| JP | 2013-219239 A | 10/2013 |
| JP | 2015-50466 A | 3/2015 |
| JP | 2015-99923 A | 5/2015 |
| JP | 2015-128192 A | 7/2015 |
| JP | 5858643 B2 | 2/2016 |
| JP | 2017-10951 A | 1/2017 |
| JP | 6095951 B2 | 3/2017 |
| JP | 2017-163044 A | 9/2017 |
| JP | 2017-163108 A | 9/2017 |
| JP | 2017-163110 A | 9/2017 |
| JP | 2018-157035 A | 10/2018 |
| JP | 2020-47744 A | 3/2020 |

* cited by examiner

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2019-048973, filed on Mar. 15, 2019, the entire contents of which are incorporated herein by reference.

FIELD

Embodiments described herein relate to a semiconductor device and a method of manufacturing the same.

BACKGROUND

Integration of a semiconductor memory such as a three-dimensional memory has been improved year by year. Accordingly, unless a flow of carriers in or near memory cells is controlled with high accuracy, it may be difficult to cause a highly integrated semiconductor memory to perform a desired operation. For example, the carriers may flow among the memory cells, resulting in erroneous writing into a non-selected cell.

DETAILED DESCRIPTION

Figure 1:
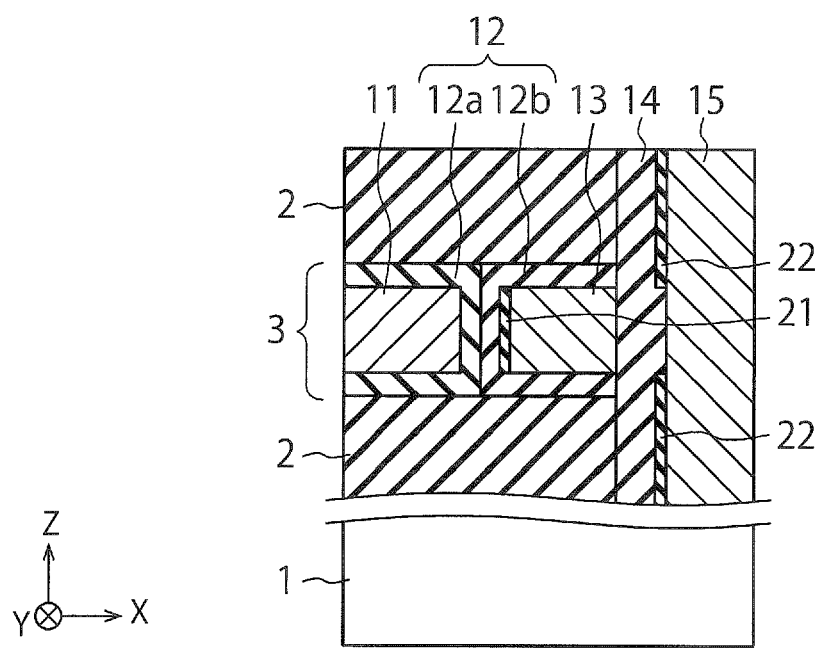
FIG. 1 is a cross-sectional view illustrating a structure of a semiconductor device of a first embodiment.

In one embodiment, a semiconductor device includes a substrate, a plurality of insulating films and a plurality of first films alternately stacked on the substrate, at least one of the first films including an electrode layer and a charge storage layer provided on a face of the electrode layer via a first insulator, the face of the electrode layer being parallel to a direction of the stacking, and a semiconductor layer provided on a face of the charge storage layer via a second insulator, the face of the charge storage layer being parallel to the direction of the stacking. The device further includes at least one of a first portion including nitrogen and provided at least between the first insulator and the charge storage layer with an air gap provided in the first insulator, a second portion including nitrogen, provided at least between the charge storage layer and the second insulator, and including a portion protruding toward the charge storage layer, and a third portion including nitrogen and provided at least between the second insulator and the semiconductor layer with an air gap provided in the first insulator.

Embodiments will now be explained with reference to the accompanying drawings. In FIGS. 1 to 30B, identical or similar components are respectively assigned identical reference numerals, and overlapping description thereof is omitted.

First Embodiment

FIG. 1 is a cross-sectional view illustrating a structure of a semiconductor device of a first embodiment. The semiconductor device illustrated in FIG. 1 is a three-dimensional memory, for example.

The semiconductor device illustrated in FIG. 1 includes a substrate 1 and a plurality of insulating layers 2 and a plurality of intermediate portions 3 that are alternately stacked on the substrate 1. The insulating layers 2 are an example of a plurality of insulating films, and the intermediate portions 3 are an example of a plurality of first films. FIG. 1 illustrates two of the insulating layers 2 and one of the intermediate portions 3.

The intermediate portion 3 includes an electrode layer 11, a block insulator 12, and a charge storage layer 13 as components of a memory cell in a three-dimensional memory. The semiconductor device illustrated in FIG. 1 further includes a tunnel insulator 14 and a channel semiconductor layer 15 that are continuously provided on respective side faces of the insulating layers 2 and the intermediate portion 3. The block insulator 12 is an example of a first insulator, and the tunnel insulator 14 is an example of a second insulator. The block insulator 12 includes two insulators 12a and 12b. The insulator 12a is an example of a first layer, and the insulator 12b is an example of a second layer.

The semiconductor device illustrated in FIG. 1 further includes silicon nitride films (SiN) 21 and 22. The silicon nitride film 21 is an example of a first portion, and the silicon nitride film 22 is an example of a third portion. The silicon nitride films 21 and 22 are each further an example of an insulator including nitrogen.

The substrate 1 is a semiconductor substrate such as a silicon (Si) substrate. FIG. 1 illustrates an X-direction and a Y-direction parallel to a surface of the substrate 1 and perpendicular to each other and a Z-direction perpendicular to the surface of the substrate 1. In the present specification, a +Z-direction is treated as an upward direction, and a −Z-direction is treated as a downward direction. The −Z-direction may or may not match a gravity direction. The Z-direction is parallel to a direction of the stacking of the plurality of insulating layers 2 and the plurality of intermediate portions 3.

The insulating layer 2 is a silicon oxide film ($SiO_2$), for example. The thickness of the insulating layer 2 is 30 nm, for example. Similarly, the thickness of the intermediate portion 3 is 30 nm, for example.

The electrode layer 11 is a metal layer such as a tungsten (W) layer, and functions as a word line. The block insulator 12 includes an insulator 12a provided on a side face, an upper face, and a lower face of the electrode layer 11 and an insulator 12b provided on a side face, an upper face, and a lower face of the charge storage layer 13. The insulator 12a is an aluminum oxide film ($AlO_X$), for example, and the insulator 12b is a silicon oxide film, for example. The insulator 12a is provided on a face that is a side face of the electrode layer 11 and opposes the charge storage layer 13, and the insulator 12b is provided on a face that is a side face of the charge storage layer 13 and opposes the electrode layer 11. The upper layer of the electrode layer 11 is a face opposing the insulating layer 2 positioned above the electrode layer 11 among the faces of the electrode layer 11. The lower face of the electrode layer 11 is a face opposing the insulating layer 2 positioned below the electrode layer 11 among the surfaces of the electrode layer 11. The side face of the electrode layer 11 is a face positioned between the upper face and the lower face of the electrode layer 11 among the faces of the electrode layer 11. The same applies to the side face, the upper face and the lower face of the charge storage layer 13.

The charge storage layer 13 is formed on the side face of the electrode layer 11 via the block insulator 12 (the insulators 12a and 12b). The charge storage layer 13 functions as a layer storing a charge for data storage. The charge storage layer 13 is a silicon layer, for example, and the silicon layer stores the charge. The charge storage layer 13 is also referred to as a floating electrode. The charge storage layer 13 may be formed of a metal layer or an insulator layer 13 functioning as a layer storing the charge.

The tunnel insulator 14 is continuously formed on the side face of the charge storage layer 13 and the side faces of the insulating layers 2. The tunnel insulator 14 is a silicon oxide film, for example. The channel semiconductor layer 15 is formed on the side face of the charge storage layer 13 and the side faces of the insulating layers 2 via the tunnel insulator 14. The channel semiconductor layer 15 is a silicon layer.

The silicon nitride film 21 is formed between the block insulator 12 and the charge storage layer 13, and specifically is formed on the side face of the charge storage layer 13. The silicon nitride film 22 is formed between the tunnel insulator 14 and the channel semiconductor layer 15, and specifically is divided into an upper portion and a lower portion along the side face of the charge storage layer 13. In FIG. 1, the upper portion and the lower portion of the silicon nitride film 22 are arranged along the side faces of the insulating layers 2.

The silicon nitride films 21 and 22 in the present embodiment may be replaced with portions each containing nitrogen but remaining less than a film, although each formed as a film containing nitrogen. That is, the portions each containing nitrogen but remaining less than a film may be respectively formed between the block insulator 12 and the charge storage layer 13 or between the tunnel insulator 14 and the channel semiconductor layer 15 instead of the silicon nitride films 21 and 22. The portions are also respectively examples of the first portion and the third portion.

Details of the silicon nitride films 21 and 22 will be described below.

The semiconductor device of the present embodiment reverses a channel between cells by a fringe electric field that has leaked out of a word line (the electrode layer 11) to cause carriers to flow because it does not include a diffusion layer. To promote this, impurities can conceivably be added into the charge storage layer 13 (the silicon layer). However, the impurities are not easily added if the thickness of the charge storage layer 13 is small. On the other hand, when a high voltage is applied to the word line in the non-selected cell to reverse the channel between the cells, erroneous writing into the non-selected cell may occur.

The semiconductor device of the present embodiment includes the silicon nitride film 21 between the block insulator 12 and the charge storage layer 13, and includes the silicon nitride film 22 between the tunnel insulator 14 and the channel semiconductor layer 15. Accordingly, problems such as erroneous writing into the non-selected cell can be suppressed.

For example, the silicon nitride film 22 in the present embodiment is formed along the side faces of the insulating layers 2, and is divided into the upper portion and the lower portion along the side face of the charge storage layer 13. Therefore, according to the present embodiment, a nitrogen concentration in a region between the tunnel insulator 14 and the channel semiconductor layer 15 can be made higher in a region between the cells than that in a region of a cell portion. Accordingly, a threshold voltage between the cells can be reduced, and the channel between the cells can be reversed even when a high voltage is not applied to the word line in the non-selected cell. As a result, erroneous writing into the non-selected cell can be reduced. In the present embodiment, when the threshold voltage between the cells is reduced, an ON current increases.

The silicon nitride film 22 in the present embodiment can suppress charge trapping, and accordingly can suppress a variation of the ON current. Therefore, according to the present embodiment, a reading time period from the cell can be shortened, whereby erroneous writing into the non-selected cell can be further reduced.

The silicon nitride film 21 in the present embodiment can provide a layer having a high dielectric constant between the block insulator 12 and the charge storage layer 13. Accordingly, a leak current from the cell can be reduced, and a writing characteristic into the cell can be improved.

As described above, according to the present embodiment, a flow of the carriers can be controlled with high accuracy, whereby problems such as erroneous writing into the non-selected cell can be suppressed.

FIGS. 2A to 5C are cross-sectional views illustrating a method of manufacturing the semiconductor device of the first embodiment.

Figure 2A:
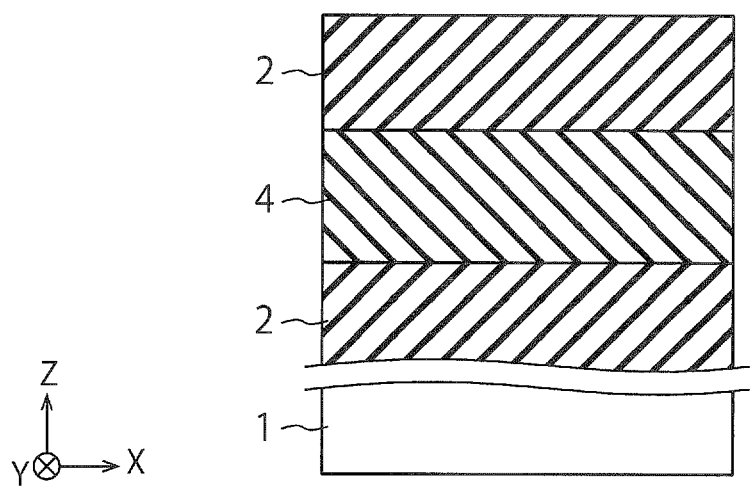
FIGS. 2A to 5C are cross-sectional views illustrating a method of manufacturing the semiconductor device of the first embodiment.

First, a plurality of insulating layers 2 and a plurality of sacrifice layers 4 are alternately formed on a substrate 1 (FIG. 2A). The insulating layer 2 is a silicon oxide film having a thickness of 30 nm, for example, and is formed using TEOS (tetraethyl orthosilicate) at a temperature of 300 to 700° C. in a reduced pressure environment (e.g., 2000 Pa or less) by CVD (chemical vapor deposition). The sacrifice layer 4 is a silicon nitride film having a thickness of 30 nm, for example, and is formed using $SiH_4$ and $NH_3$ (H represents hydrogen) in a reduced pressure environment (e.g., 2000 Pa or less) by CVD. The sacrifice layer 4 is an example of a second film.

Figure 2B:
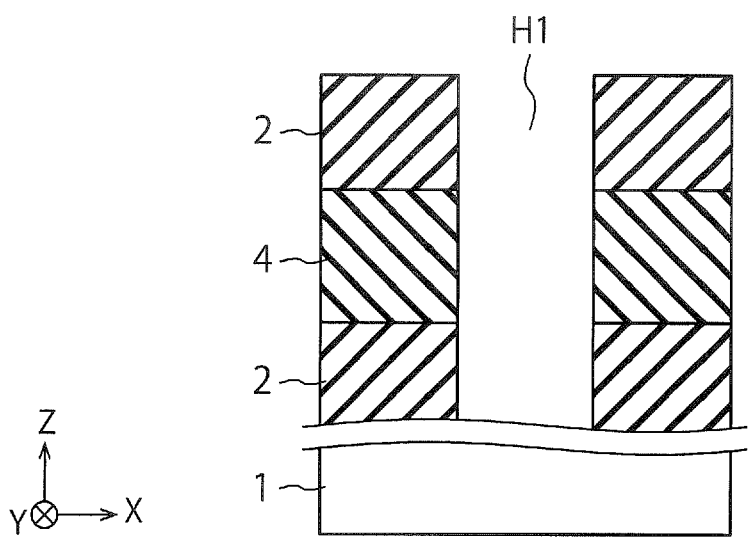

Then, a trench H1 is formed in the insulating layers 2 and the sacrifice layers 4 by RIE (reactive ion etching). The trench H1 is formed to extend in a Y-direction. In a process illustrated in FIG. 2B, a plurality of trenches extending in the Y-direction are formed, and FIG. 2B illustrates one of the trenches. Description related to the trench H1 is also similarly applied to the trenches other than the trench H1.

Figure 2C:
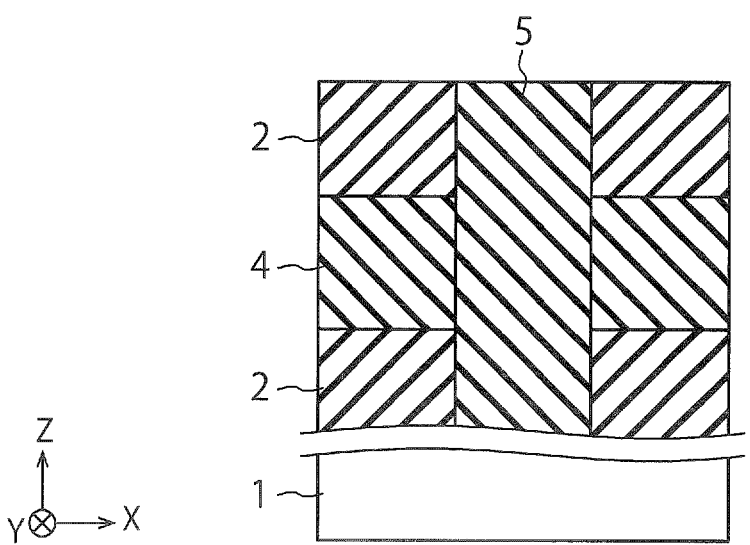

Then, an insulator 5 is embedded in the trench H1 (FIG. 2C). The insulator 5 is a silicon oxide film, for example.

Figure 3A:
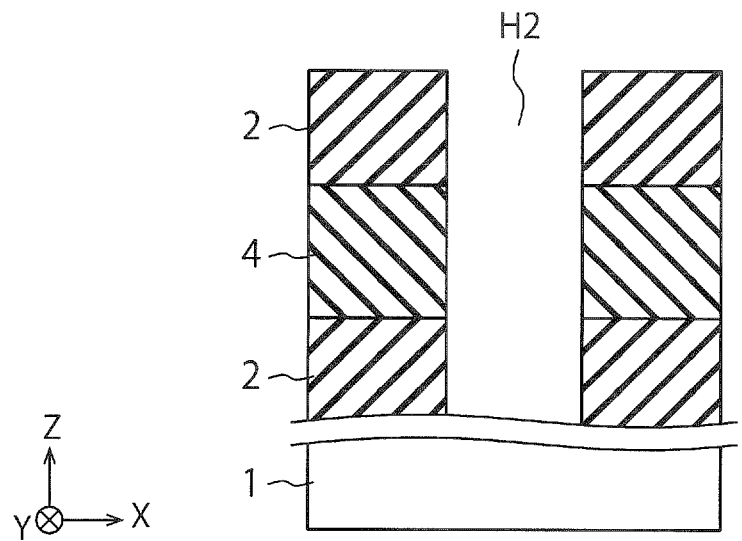
Figure 3B:
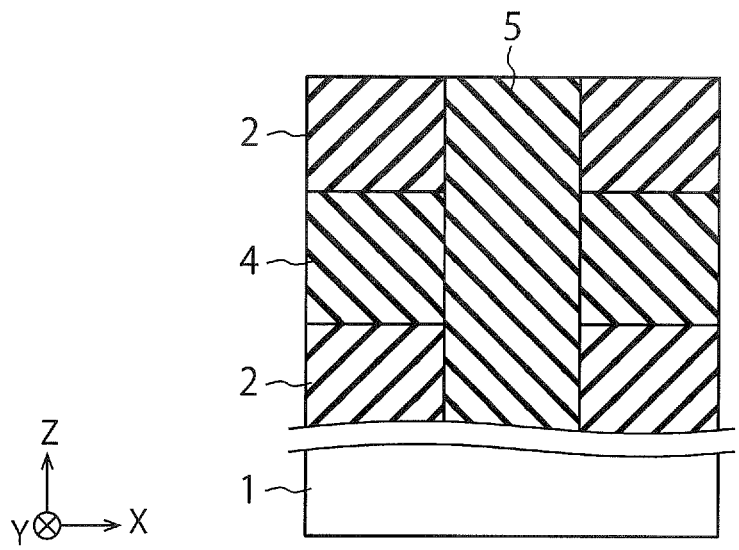
Figure 3C:
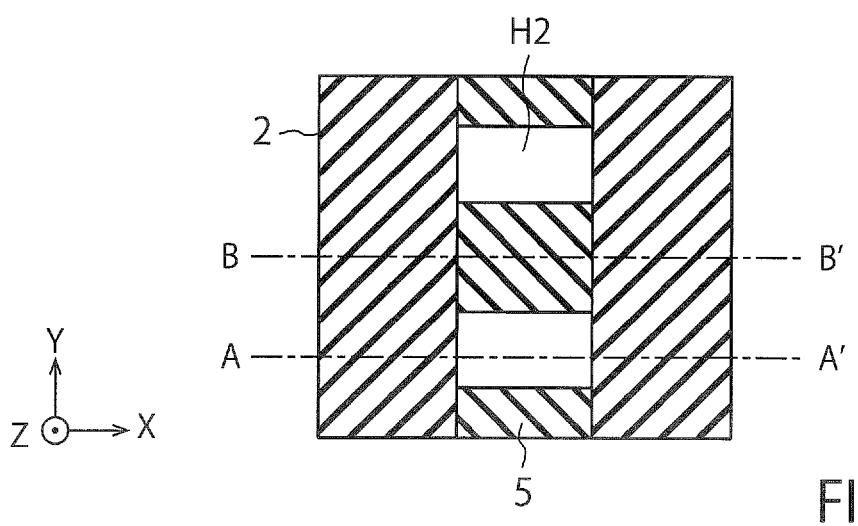

Then, a plurality of holes H2 are formed in the insulator 5 by RIE (FIGS. 3A, 3B and 3C). FIG. 3A illustrates the same XZ cross section as those illustrated in FIGS. 2A to 2C, and FIG. 3B illustrates a different XZ cross section from that illustrated in FIG. 3A. FIG. 3C illustrates an XY cross section at a certain height of the insulating layers 2. FIGS. 3A and 3B respectively illustrate XZ cross sections on an A-A' line and a B-B' line illustrated in FIG. 3C.

Figure 4A:
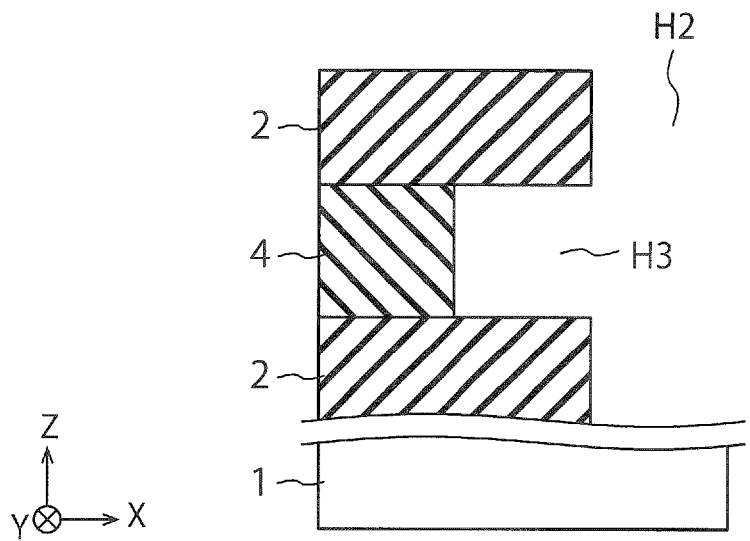

Then, a portion of each of the sacrifice layers 4 exposed to the inside of the hole H2 is selectively removed by wet etching using a hot phosphoric acid (FIG. 4A). As a result, the sacrifice layers 4 are recessed compared to the insulating layers 2, and a cavity H3 is formed on a side face of each of the sacrifice layers 4. The cavity H3 is an example of a first concave portion.

Figure 4B:
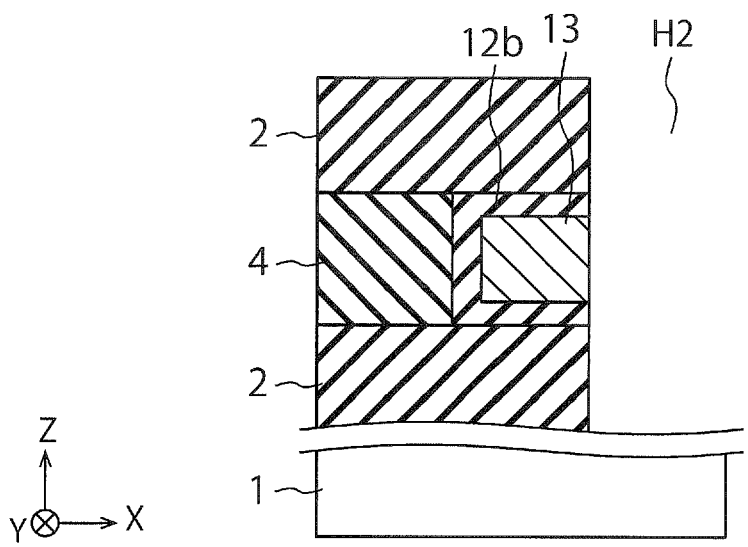

Then, an insulator 12b constituting a block insulator 12 and a charge storage layer 13 are formed in this order in the cavity H3 (FIG. 4B). The insulator 12b is a silicon oxide film having a thickness of 10 nm, for example, and is formed using TDMAS (tris(dimethylamino)silane) and $O_3$ at a temperature of 400 to 800° C. in a reduced pressure environment (e.g., 2000 Pa or less) by ALD (atomic layer deposition). The charge storage layer 13 is a silicon layer having a thickness of 10 nm, for example, and is formed using $SiH_4$ at a temperature of 400 to 800° C. in a reduced pressure environment (e.g., 2000 Pa or less) by CVD. The charge storage layer 13 outside the cavity H3 is removed using an alkaline chemical solution, and the respective charge storage layers 13 inside the different cavities H3 are separated from one another.

Figure 4C:
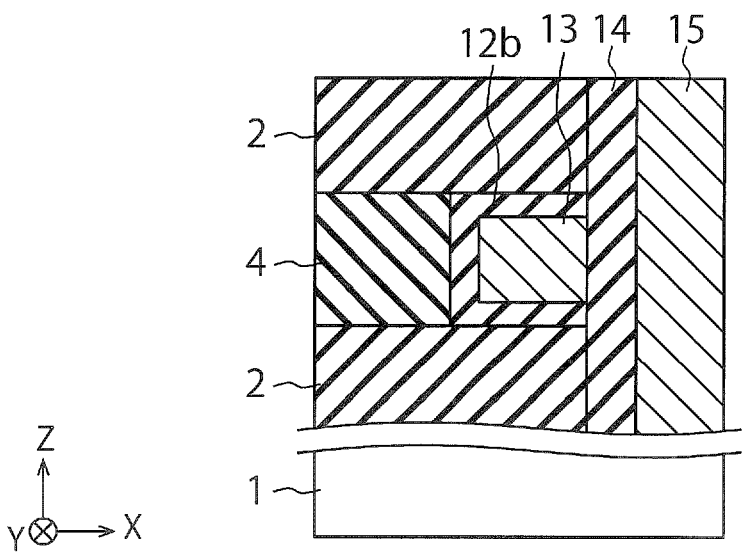

Then, a tunnel insulator 14 and a channel semiconductor layer 15 are formed in this order in each of the holes H2 (FIG. 4C). As a result, the tunnel insulator 14 and the channel semiconductor layer 15 are formed in this order on a side face of the charge storage layer 13 and respective side faces of the insulating layers 2. The tunnel insulator 14 is a silicon oxide film having a thickness of 7 nm, for example, and is formed using TDMAS and $O_3$ at a temperature of 400 to 800° C. in a reduced pressure environment (e.g., 2000 Pa or less) by ALD. The channel semiconductor layer 15 is a silicon layer having a thickness of 10 nm, for example, and is formed using $SiH_4$ at a temperature of 400 to 800° C. in a reduced pressure environment (e.g., 2000 Pa or less) by CVD.

Figure 5A:
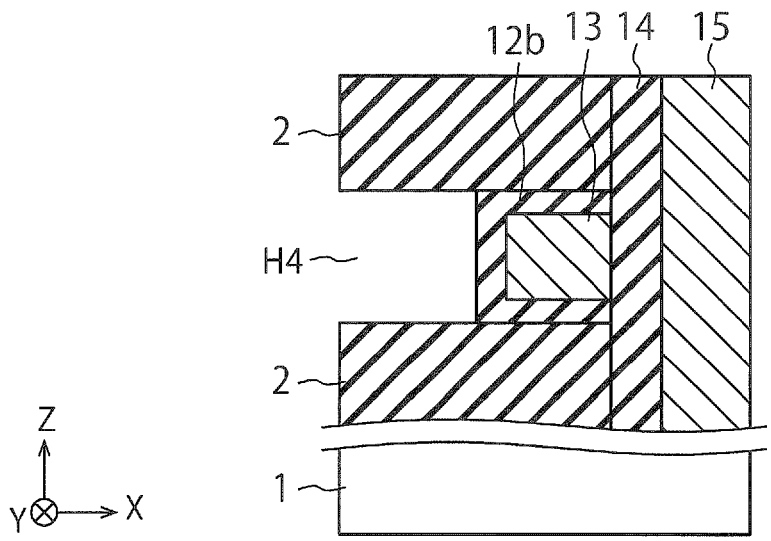

Then, a remainder of each of the sacrifice layers 4 exposed to the inside of a hole (not illustrated) is selectively removed by wet etching using a hot phosphoric acid (FIG. 5A). As a result, the sacrifice layers 4 are recessed compared to the insulating layers 2, and a cavity H4 is formed on a side face of each of the insulators 12b. The cavity H4 is an example of a second concave portion.

Figure 5B:
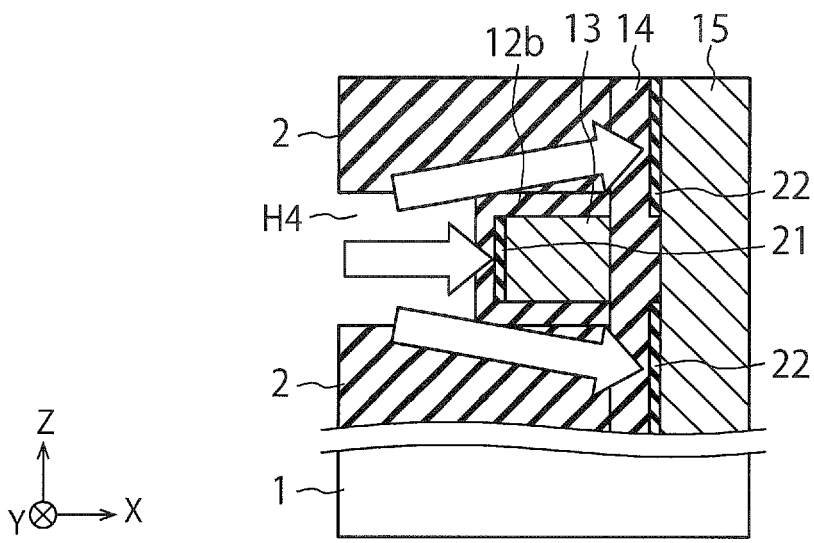

Then, nitriding treatment using the cavity H4 is performed (FIG. 5B). As a result, a silicon nitride film 21 is formed between the block insulator 12 and the charge storage layer 13, and specifically is formed on the side face of the charge storage layer 13. Further, a silicon nitride film 22 is formed between the tunnel insulator 14 and the channel semiconductor layer 15, and specifically is formed on a side of the channel semiconductor layer 15. The nitriding treatment is performed at a temperature 500° C. or more using a nitriding gas (e.g., $NH_3$), for example. Arrows illustrated in FIG. 5B schematically indicate how a nitriding gas or a substance produced by a nitriding gas progresses.

The charge storage layer 13 in the present embodiment has a function of blocking a nitriding gas or a substance produced from a nitriding gas. Therefore, the silicon nitride film 22 in the present embodiment is not formed along the side face of the charge storage layer 13, and is divided into an upper portion and a lower portion along the side face of the charge storage layer 13.

Figure 5C:
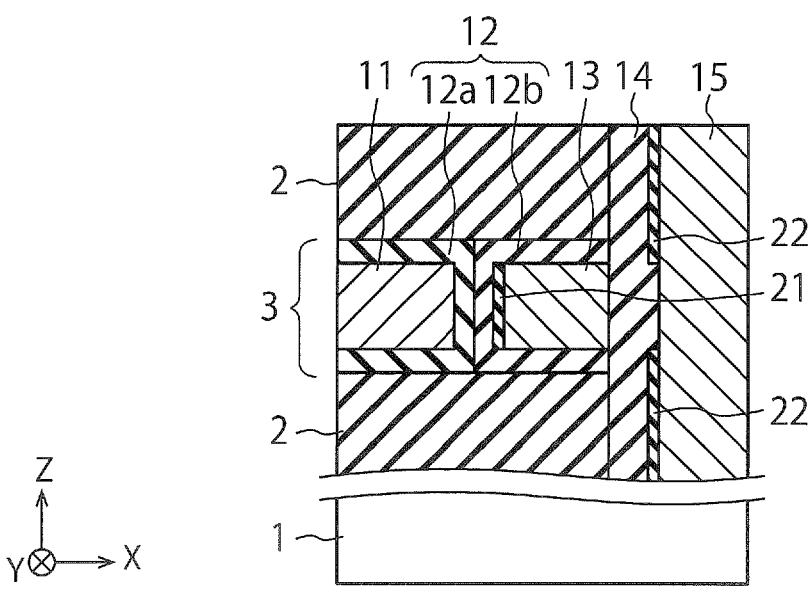

Then, an insulator 12a constituting the block insulator 12 and an electrode layer 11 are formed in this order in the cavity H4 (FIG. 5C). The insulator 12a is an aluminum oxide film, for example, and is formed at a temperature of 500° C. or less by ALD. The electrode layer 11 includes a titanium nitride film (TiN) as a barrier metal layer and a tungsten layer as an electrode material layer. The titanium nitride film is formed using $TiCl_4$ and $NH_3$ (Cl represents chlorine), for example. The tungsten layer is formed using $WF_6$ (F represents fluorine).

Then, various interconnect layers and inter layer dielectrics are formed on the substrate 1. In this manner, the semiconductor device of the present embodiment is manufactured.

More details of the present embodiment will be described below.

Although the insulating layer 2 and the sacrifice layer 4 are formed by CVD in the present embodiment, they may be formed using another method. The insulating layer 2 (the silicon oxide film) may be formed using $SiH_4$ and $N_2O$ by plasma CVD, for example. The sacrifice layer 4 (the silicon nitride film) may be formed using $SiH_2Cl_2$ and $NH_3$ by plasma CVD, for example.

Although the charge storage layer 13 is formed using $SiH_4$ in the present embodiment, it may be formed using another gas. For example, the charge storage layer 13 may be formed using $Si_2H_6$. A seed layer of the charge storage layer 13 may be formed using an organic Si source gas or $Si_2H_6$, and a main layer of the charge storage layer 13 may be formed using $SiH_4$. A P atom or a B atom may be added to the charge storage layer 13 (the silicon layer) (P represents phosphorous, and B represents boron) by supplying a $PH_3$ gas or a $BCl_3$ gas, together with a source gas in the charge storage layer 13. Accordingly, a threshold voltage of the memory cell can be adjusted to an appropriate value so that a characteristic of a memory cell can be improved.

In a process illustrated in FIG. 4B, after the charge storage layer 13 outside the cavity H3 is removed, metal elements such as Ti (titanium), Co (cobalt), Ru (ruthenium), and Ni (nickel) may be added to the charge storage layer 13. For example, a silicon layer may be formed as the charge storage layer 13, a titanium layer may be formed on the silicon layer using $TiCl_4$, and the silicon layer may be silicided by the titanium layer. In this case, the charge storage layer 13 becomes a metal layer (titanium silicide layer), whereby a writing characteristic and an erasing characteristic of the memory cell can be improved. A similar effect can also be obtained when the charge storage layer 13 is constituted by a silicon layer and a metal layer (e.g., a TiN layer) inserted into the silicon layer.

A silicon layer may be formed as the charge storage layer 13, and a portion of the silicon layer may be changed to a SiN film by adding nitrogen to the silicon layer. The charge storage layer 13 may be constituted by a silicon layer and a SiN film inserted into the silicon layer. The charge storage layer 13 can be formed during formation of the silicon layer by switching a Si source gas (e.g., a $SiH_2Cl_2$ gas) in the silicon layer to an $NH_3$ gas in situ. When nitrogen is contained in the charge storage layer 13, a charge holding property of the charge storage layer 13 can be improved, for example.

Although the tunnel insulator 14 and the insulator 12b (the silicon oxide film) are formed by ALD using TDMAS and $O_3$ in the present embodiment, they may be formed by another method using another gas. For example, the tunnel insulator 14 and the insulator 12b may be formed by CVD using $SiH_4$ and $N_2O$.

In the nitriding treatment illustrated in FIG. 5B, a gas other than $NH_3$ may be used. Examples of the gas include a NO gas and a $ND_3$ gas (D represents deuterium). When a $ND_3$ gas is used, a deuterium atom may be added to the tunnel insulator 14 and the insulator 12b. Accordingly, insulation and reliability of the tunnel insulator 14 and the insulator 12b can be improved.

In the present embodiment, when the charge storage layer 13 outside the cavity H3 is removed by a chemical solution in the process illustrated in FIG. 4B, a corner, on the side of the tunnel insulator 14, of the charge storage layer 13 is rounded by the chemical solution. Accordingly, a nitriding agent in a nitriding process enters the charge storage layer 13 from its end. As a result, an interface between the tunnel insulator 14 and the channel semiconductor layer 15 in the vicinity of the end is nitrided. In this case, a nitrogen concentration in the interface decreases toward a central portion of the cell.

If a silicon nitride film is formed on an upper face and a lower face of the charge storage layer 13 by the nitriding treatment illustrated in FIG. 5B, respective nitrogen concentrations in the vicinities of the upper face and the lower face of the charge storage layer 13 decrease downward from the upper face of the charge storage layer 13 and decrease upward from the lower face of the charge storage layer 13. The reason is that a nitrogen concentration gradient occurs in the charge storage layer 13 as the nitriding agent is diffused into the charge storage layer 13.

Although the silicon nitride film 21 is formed between the block insulator 12 and the charge storage layer 13 and the silicon nitride film 22 is formed between the tunnel insulator 14 and the channel semiconductor layer 15 in the present embodiment, silicon nitride films may be respectively formed between the charge storage layer 13 and the tunnel insulator 14 and between the insulating layers 2 and the tunnel insulator 14. For example, a silicon nitride film can be formed between the charge storage layer 13 and the tunnel insulator 14 by performing nitriding treatment at a temperature of 500° C. or more using NO, $NH_3$, or $ND_3$ after the tunnel insulator 14 is formed. In this case, a silicon nitride film may also be formed between the tunnel insulator 14 and the channel semiconductor layer 15 by performing nitriding treatment at a temperature of 500° C. or more using NO after the channel semiconductor layer 15 is formed. The silicon nitride film is formed not only along the side faces of the insulating layers 2 but also along the side face of the charge storage layer 13.

If the silicon nitride film is formed between the tunnel insulator 14 and the channel semiconductor layer 15, the silicon nitride film 22 is formed again between the tunnel insulator 14 and the channel semiconductor layer 15 by the nitriding treatment illustrated in FIG. 5B. Accordingly, a nitrogen concentration of a portion where the silicon nitride film 22 is formed in the interface between the tunnel insulator 14 and the channel semiconductor layer 15 becomes higher than a nitrogen concentration of the other portion. Accordingly, a threshold voltage of a transistor between the cells can be further reduced.

If a semiconductor device including a silicon nitride film between the charge storage layer 13 and the tunnel insulator 14 is manufactured, the side face of the charge storage layer 13 may be nitrided after the charge storage layer 13 is formed and before the tunnel insulator 14 is formed. In this case, nitriding may be performed by plasma nitriding or radial nitriding using $N_2$, $NH_3$, $ND_3$, or NO.

Details of a silicon nitride film other than the silicon nitride films 21 and 22 will be described below.

Although the insulator 12a constituting the block insulator 12 is an aluminum oxide film in the present embodiment, it may be another insulator. For example, the insulator 12a may be a stacked film alternately including two or more silicon nitride films and one or more silicon oxide films, or may be a high-k insulator (high-dielectric constant insulator) other than an aluminum oxide film. Examples of the high-k insulator include a $HfO_X$ film and an $LaAlO_X$ film (Hf represents hafnium, and La represents lanthanum). The insulator 12a may be a stacked film including a silicon oxide film and a high-k insulator. The foregoing materials are also applicable to the tunnel insulator 14.

Various modifications to the first embodiment will be described below.

Figure 6:
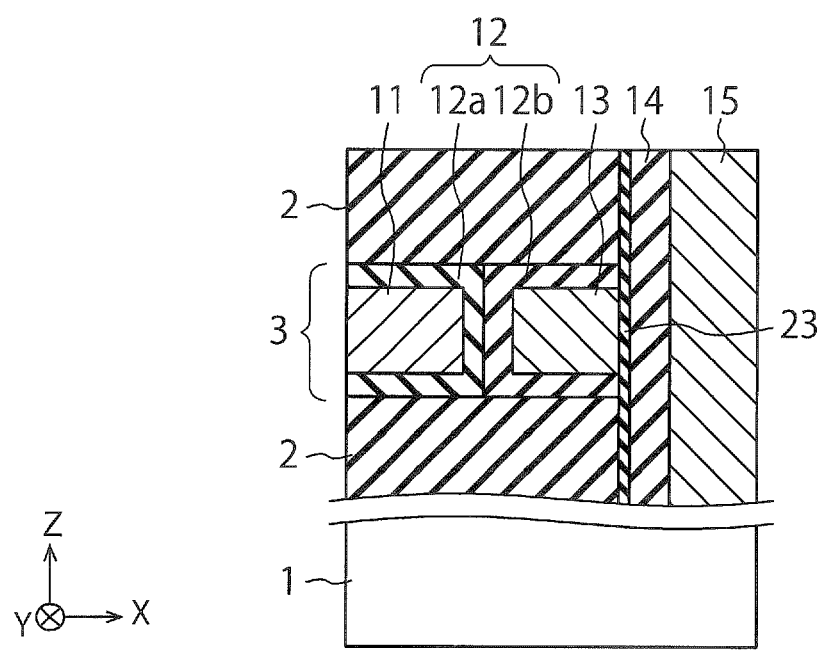
FIG. 6 is a cross-sectional view illustrating a structure of a semiconductor device of a first modification to the first embodiment.

FIG. 6 is a cross-sectional view illustrating a structure of a semiconductor device of a first modification to the first embodiment.

The semiconductor device illustrated in FIG. 6 includes a silicon nitride film 23 instead of the silicon nitride films 21 and 22. The silicon nitride film 23 is formed between a charge storage layer 13 and a tunnel insulator 14 and between insulating layers 2 and the tunnel insulator 14, and specifically is formed between a side face of the charge storage layer 13 and respective side faces of the insulating layers 2. The silicon nitride film 23 is an example of a second portion.

Figure 7A:
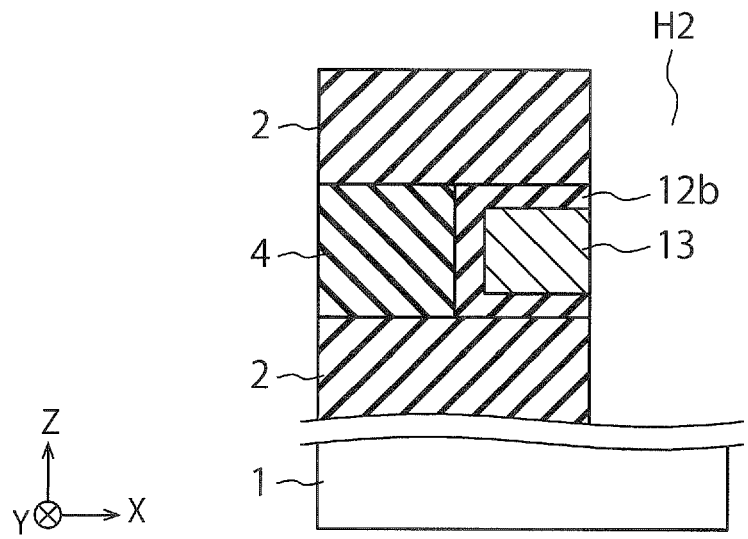
FIGS. 7A and 7B are cross-sectional views illustrating a method of manufacturing the semiconductor device of the first modification to the first embodiment.
Figure 7B:
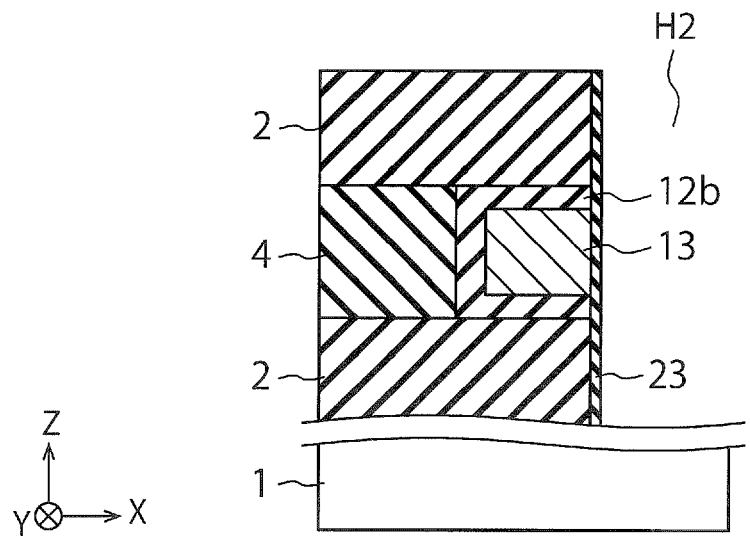

FIGS. 7A and 7B are cross-sectional views illustrating a method of manufacturing the semiconductor device of the first modification to the first embodiment.

First, processes from FIG. 2A to FIG. 4B are performed. FIG. 7A illustrates the same cross section as that illustrated in FIG. 4B. Then, a silicon nitride film 23 is formed on respective side faces, exposed to the inside of a hole H2, of a charge storage layer 13 and insulating layers 2 (FIG. 7B). The silicon nitride film 23 may be formed by CVD or may be formed by plasma nitriding or radial nitriding, for example. If the silicon nitride film 23 is formed by nitriding, at least a portion of the silicon nitride film 23 may be another insulator (e.g., a silicon oxynitride film) containing silicon and nitrogen.

In the present modification, processes from FIG. 4C to FIG. 5C are then performed. In such a manner, the semiconductor device of the present modification is manufactured.

Figure 8:
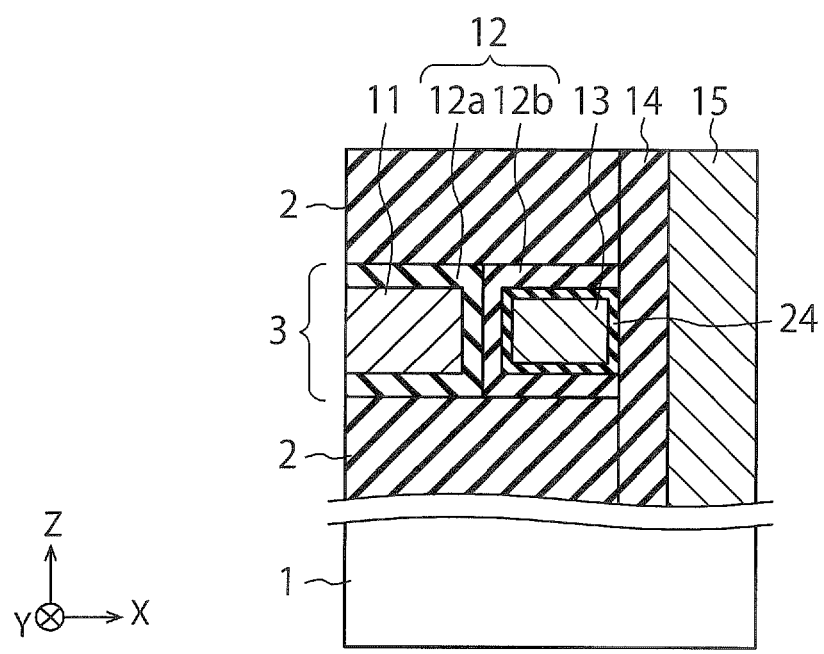
FIG. 8 is a cross-sectional view illustrating a structure of a semiconductor device of a second modification to the first embodiment.

FIG. 8 is a cross-sectional view illustrating a structure of a semiconductor device of a second modification to the first embodiment.

The semiconductor device illustrated in FIG. 8 includes a silicon nitride film 24 instead of the silicon nitride films 21 and 22. The silicon nitride film 24 is formed between a block insulator 12 and a charge storage layer 13 and between the charge storage layer 13 and a tunnel insulator 14, and specifically is formed on a side face, an upper face, and a lower face of the charge storage layer 13. The silicon nitride film 24 of the present modification covers the entire surface of the charge storage layer 13. The silicon nitride film 24 is an example of a first portion and a second portion.

Figure 9A:
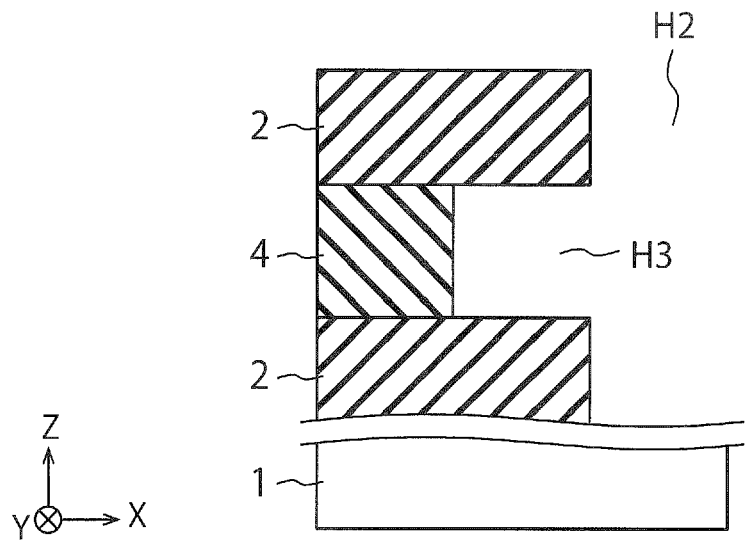
FIGS. 9A to 9C are cross-sectional views illustrating a method of manufacturing the semiconductor device of the second modification to the first embodiment.
Figure 9B:
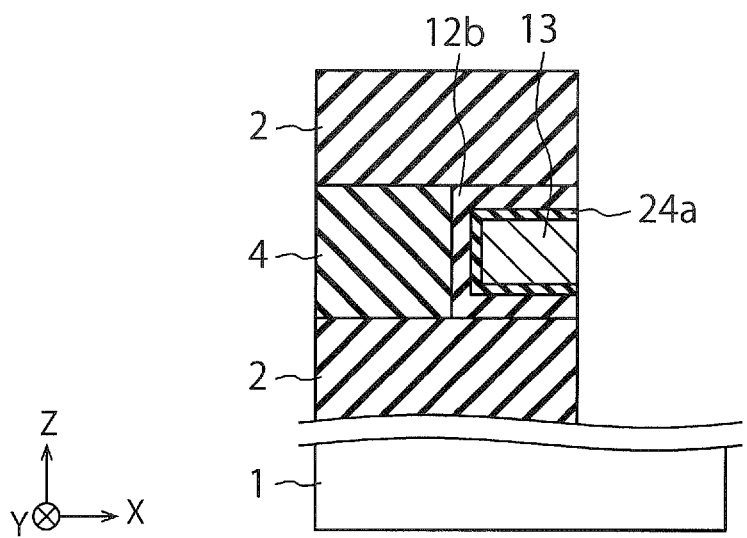
Figure 9C:
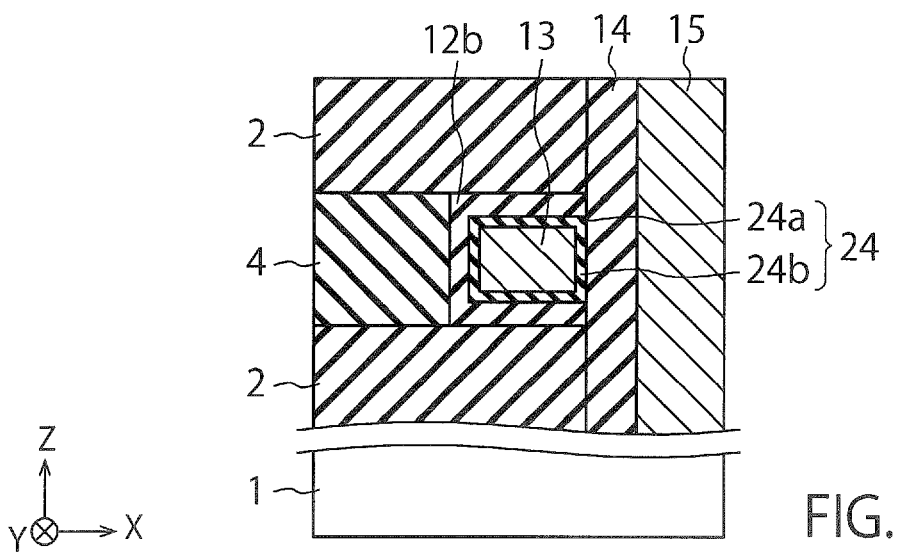

FIGS. 9A to 9C are cross-sectional views illustrating a method of manufacturing the semiconductor device of the second modification to the first embodiment.

First, the processes from FIG. 2A to FIG. 4A are performed. FIG. 9A illustrates the same cross section as that illustrated in FIG. 4A. Then, an insulator 12b constituting a block insulator 12, an insulator (silicon nitride film) 24a constituting a silicon nitride film 24, and a charge storage layer 13 are formed in this order in a cavity H3 (FIG. 9B). The insulator 24a is formed by CVD, for example.

Then, an insulator (silicon nitride film) 24b constituting the silicon nitride film 24 is formed on a side face, exposed to the inside of a hole H2, of the charge storage layer 13 (FIG. 9C). The insulator 24a is formed by nitriding the side face of the charge storage layer 13, for example. Then, a tunnel insulator 14 and a channel semiconductor layer 15 are formed in this order in each of holes H2 (FIG. 9C).

In the present modification, the processes from FIG. 5A to FIG. 5C are then performed. In such a manner, the semiconductor device of the present modification is manufactured.

Figure 10:
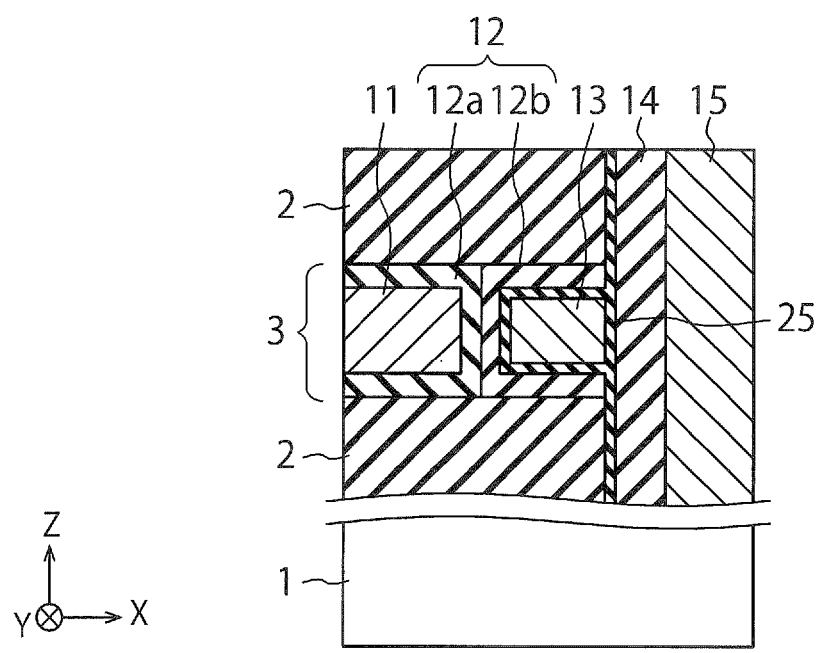
FIG. 10 is a cross-sectional view illustrating a structure of a semiconductor device of a third modification to the first embodiment.

FIG. 10 is a cross-sectional view illustrating a structure of a semiconductor device of a third modification to the first embodiment.

The semiconductor device illustrated in FIG. 10 includes a silicon nitride film 25 instead of the silicon nitride films 21 and 22. The silicon nitride film 25 is formed between a block insulator 12 and a charge storage layer 13 and between the charge storage layer 13 and a tunnel insulator 14, and specifically is formed on a side face, an upper face, and a lower face of the charge storage layer 13. The silicon nitride film 25 is further formed on respective side faces of the insulating layers 2. The silicon nitride film 25 in the present modification covers the entire surface of the charge storage layer 13, like the silicon nitride film 24 in the second modification. The silicon nitride film 25 is an example of a first portion and a second portion.

Figure 11A:
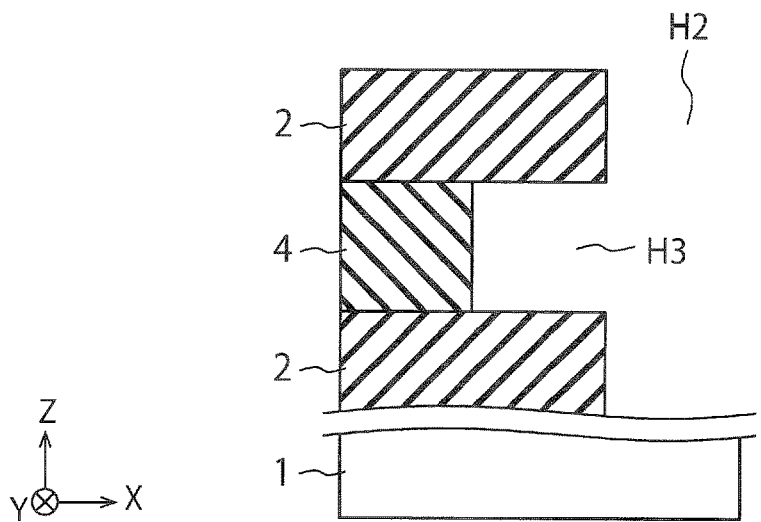
FIGS. 11A to 11C are cross-sectional views illustrating a method of manufacturing the semiconductor device of the third modification to the first embodiment.
Figure 11B:
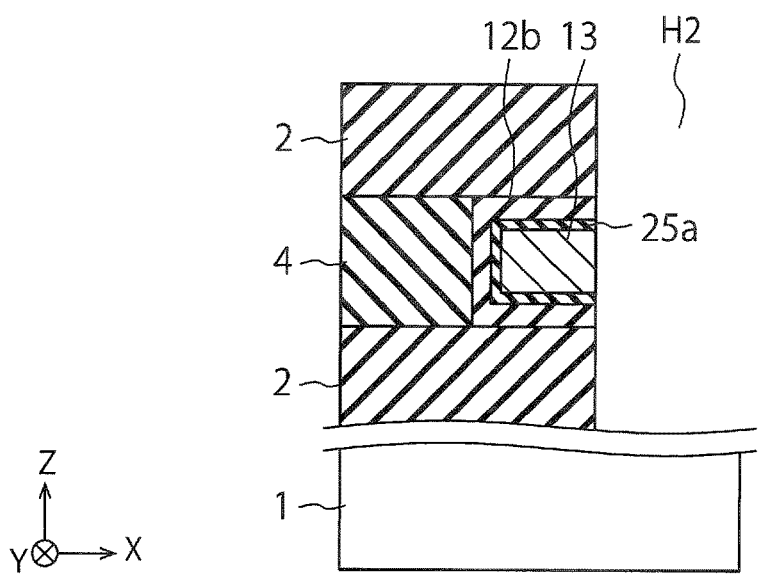
Figure 11C:
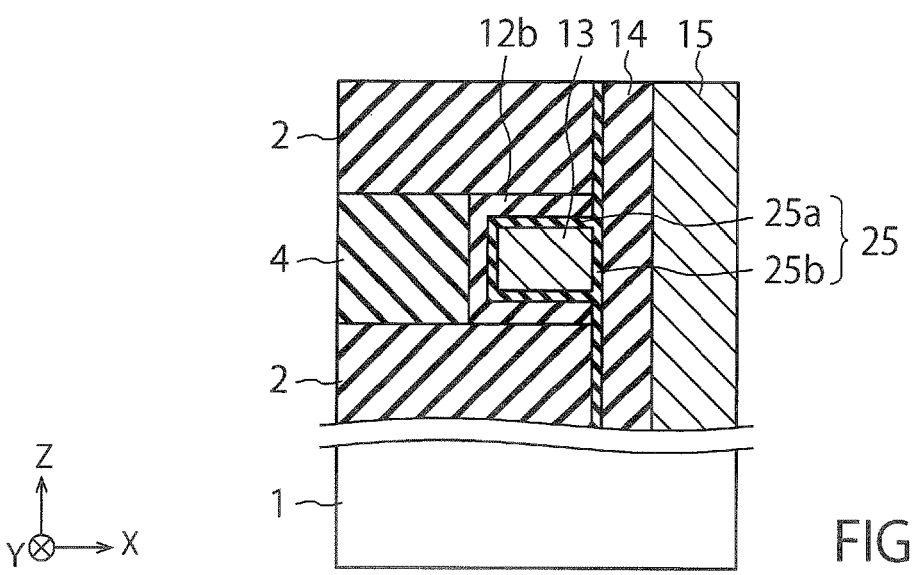

FIGS. 11A to 11C are cross-sectional views illustrating a method of manufacturing the semiconductor device of the third modification to the first embodiment.

First, the processes from FIG. 2A to FIG. 4A are performed. FIG. 11A illustrates the same cross section as that illustrated in FIG. 4A. Then, an insulator 12b constituting a block insulator 12, an insulator (silicon nitride film) 25a constituting a silicon nitride film 25, and a charge storage layer 13 are formed in this order in a cavity H3 (FIG. 11B). The insulator 25a is formed by CVD, for example.

Then, an insulator (silicon nitride film) 25b constituting the silicon nitride film 25 is formed on respective side faces, exposed to the inside of the hole H2, of the charge storage layer 13 and insulating layers 2 (FIG. 11C). The insulator 25b may be formed by CVD or may be formed by plasma nitriding or radial nitriding, for example. If the insulator 25b is formed by nitriding, at least a portion of the insulator 25b may be another insulator (e.g., a silicon oxynitride film) containing silicon and nitrogen.

In the present modification, the processes from FIG. 5A to FIG. 5C are then performed. In such a manner, the semiconductor device of the present modification is manufactured.

According to the modifications, when the silicon nitride films 23, 24, and 25 are formed, a similar effect to that when the silicon nitride films 21 and 22 are formed can be obtained. For example, charge trapping to the tunnel insulator 14 or the like can be suppressed, and a leak current from a cell can be reduced. Accordingly, problems such as erroneous writing into a non-selected cell can be suppressed.

As described above, in the present embodiment and the modifications, the silicon nitride films 21 to 25 are each formed between the block insulator 12 and the charge storage layer 13, between the charge storage layer 13 and the tunnel insulator 14, or between the tunnel insulator 14 and the channel semiconductor layer 15. Therefore, according to the present embodiment and the modifications, the flow of carriers can be controlled with high accuracy, whereby problems such as erroneous writing into the non-selected cell can be suppressed.

Second Embodiment

Figure 12:
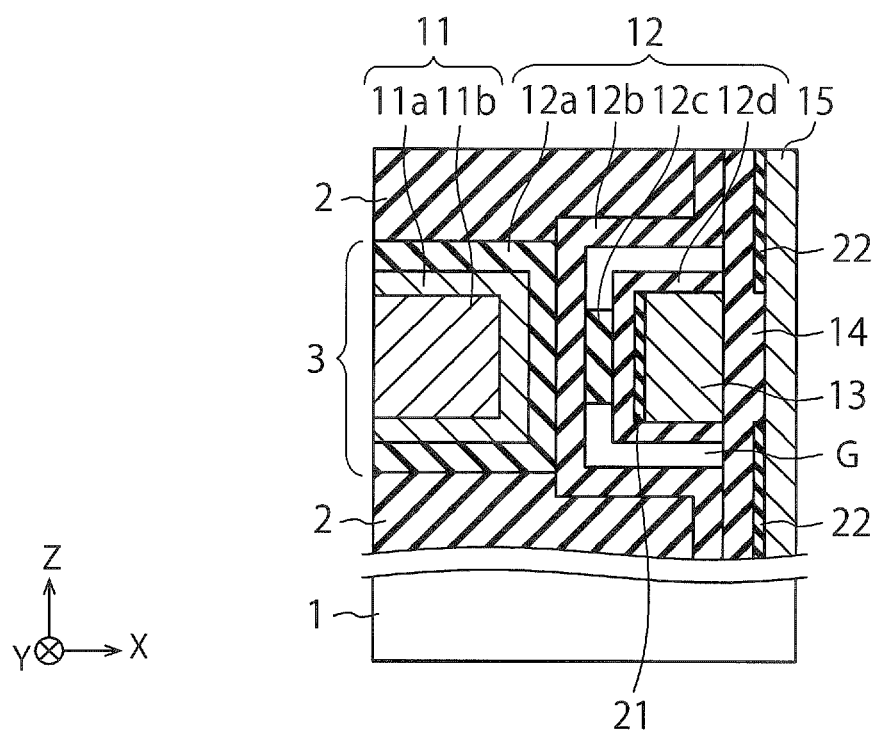
FIG. 12 is a cross-sectional view illustrating a structure of a semiconductor device of a second embodiment.

FIG. 12 is a cross-sectional view illustrating a structure of a semiconductor device of a second embodiment.

The semiconductor device illustrated in FIG. 12 includes silicon nitride films 21 and 22, like the semiconductor device illustrated in FIG. 1. FIG. 12 further illustrates a barrier metal layer 11a and an electrode material layer 11b that constitutes an electrode layer 11, and insulators 12c and 12d that, together with insulators 12a and 12b, constitute a block insulator 12. The insulator 12a is an example of a first layer, and the insulators 12b, 12c, and 12d are each an example of a second layer.

The electrode layer 11 includes the barrier metal layer 11a provided on a side face, an upper face, and a lower face of the insulator 12a, and the electrode material layer 11b provided on a side face, an upper face, and a lower face of the barrier metal layer 11a. The barrier metal layer 11a is a TiN layer, for example. The electrode material layer 11b is a W layer, for example.

The block insulator 12 includes the insulator 12a provided on a side face, an upper face, and a lower face of the electrode layer 11, and the insulators 12d, 12c, and 12b that are provided in this order on a side face, an upper face, and a lower face of the charge storage layer 13. The insulator 12a is an aluminum oxide film, for example. The insulator 12b is a silicon oxide film, for example. The insulator 12c is a silicon nitride film or a high-k insulator (high-dielectric constant insulator) containing a metal. The insulator 12d is a silicon oxide film, for example. According to the present embodiment, when the insulator 12c is provided between the insulators 12b and 12d, the performance of the block insulator 12 on the side of the charge storage layer 13 can be improved.

The block insulator 12 includes an air gap G in the insulators 12b, 12c, and 12d positioned on the side of the charge storage layer 13. The air gap G in the present embodiment is sandwiched between the insulator 12b and the insulator 12d, like the insulator 12c. As described below, the air gap G is formed by removing a portion of the insulator 12c.

According to the present embodiment, when the air gap G is included in the block insulator 12, it is possible to reduce an interference between cells, to reduce a leak current from the cell, and to reduce erroneous writing caused by the insulator 12c.

Figure 13A:
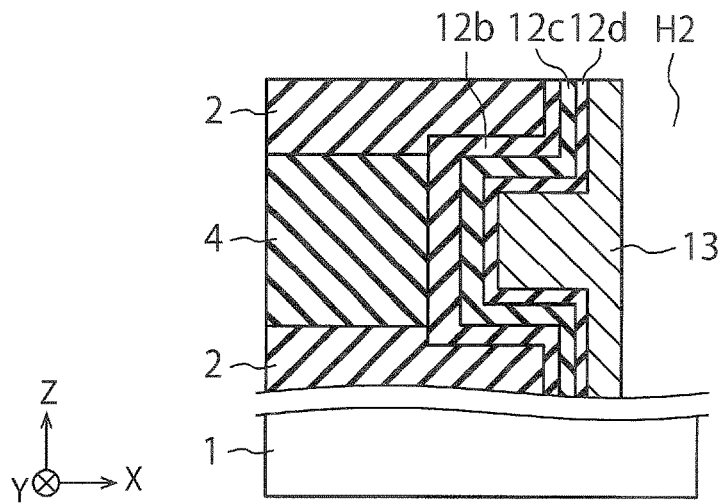
FIGS. 13A to 13C are cross-sectional views illustrating a method of manufacturing the semiconductor device of the second embodiment.
Figure 13B:
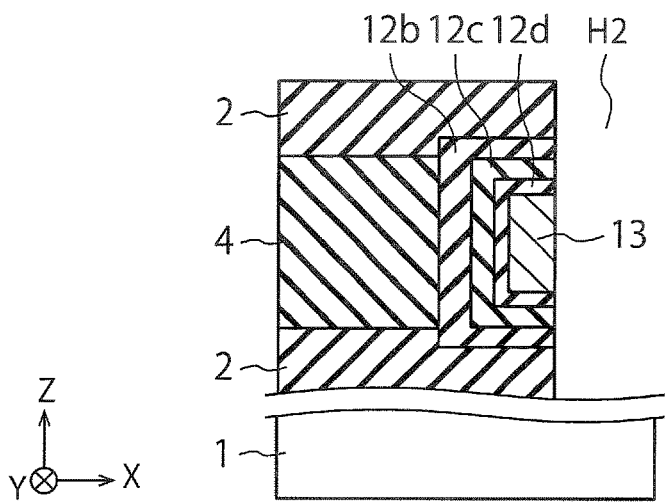
Figure 13C:
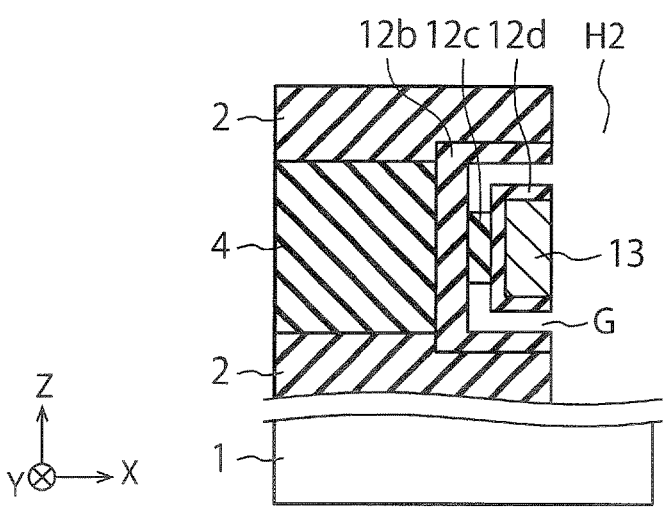

FIGS. 13A to 13C are cross-sectional views illustrating a method of manufacturing the semiconductor device of the second embodiment.

First, after the processes from FIG. 2A to FIG. 4A are performed, insulators 12b, 12c, and 12d and a charge storage layer 13 are formed in this order in a cavity H3, for example (FIG. 13A). The insulators 12b, 12c, and 12d are formed by CVD and ALD, for example.

Then, the charge storage layer 13 and the insulators 12d and 12c outside the cavity H3 are removed by wet etching using an alkaline chemical solution (FIG. 13B). As a result, charge storage layers 13 in different cavities H3 are separated from one another.

Then, a portion of the insulator 12c is selectively removed by wet etching from a hole H2 (FIG. 13C). As a result, a side face of the insulator 12c is recessed, and an air gap G is formed between the insulators 12d and 12b.

In the present embodiment, the processes illustrated in FIGS. 4C to 5C are then performed. In such a manner, the semiconductor device of the present embodiment is manufactured.

Figure 14A:
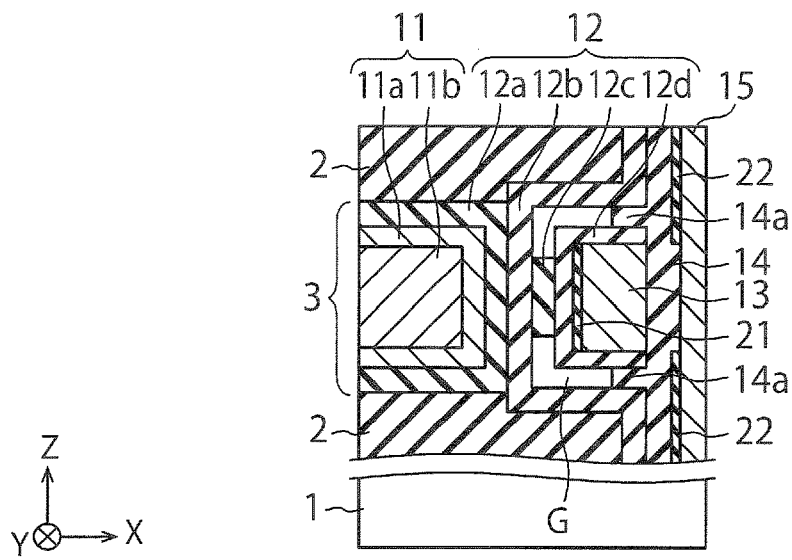
FIGS. 14A to 14C are cross-sectional views illustrating structures of semiconductor devices of modifications to the second embodiment.
Figure 14B:
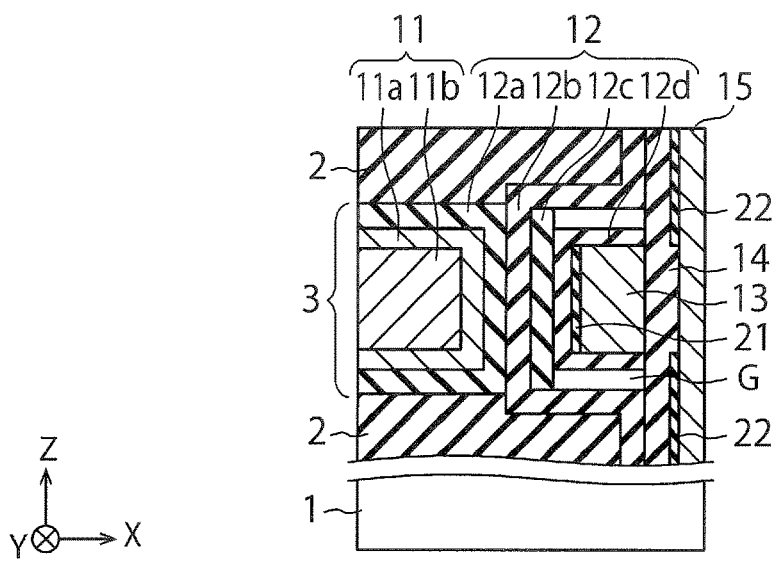
Figure 14C:
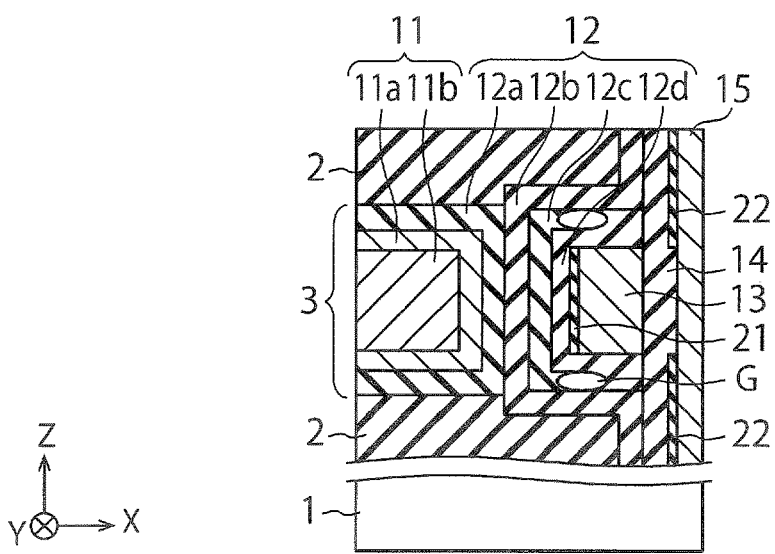

FIGS. 14A to 14C are cross-sectional views illustrating structures of semiconductor devices of modifications to the second embodiment.

In the modification illustrated in FIG. 14A, a portion (convex portion) 14a of a tunnel insulator 14 enters an air gap G. Such a structure can be implemented when the portion 14a of the tunnel insulator 14 enters the air gap G when the tunnel insulator 14 is formed.

In the modification illustrated in FIG. 14B, an air gap G is formed only on an upper face and a lower face of an insulator 12d, and does not extend to a side face of the insulator 12d. Such a structure can be implemented when a recess amount of an insulator 12c is reduced in a process illustrated in FIG. 13C.

In the modification illustrated in FIG. 14C, an air gap G is formed to be further smaller than that in the modification illustrated in FIG. 14B, and the air gap G is completely surrounded by insulators 12d and 12b. Such a structure can be implemented when a recess amount of an insulator 12c is further reduced in the process illustrated in FIG. 13C. In FIG. 14C, an insulator contacting a right end of the air gap G may be a portion 14a of a tunnel insulator 14 instead of the insulator 12d.

A shape of the air gap G may be a shape illustrated in FIG. 14A, 14B or 14C instead of the shape illustrated in FIG. 12.

Figure 15A:
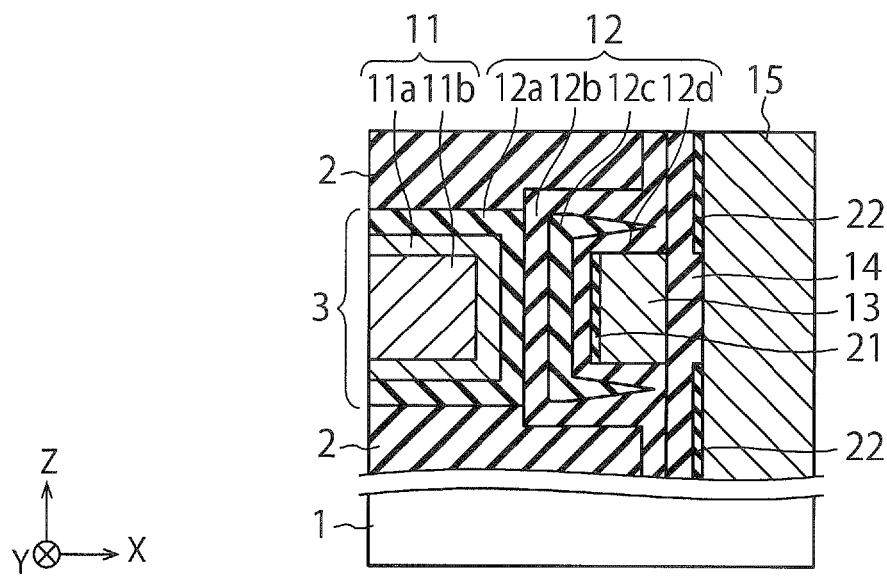
FIGS. 15A and 15B are cross-sectional views illustrating structures of semiconductor devices of other modifications to the second embodiment.
Figure 15B:
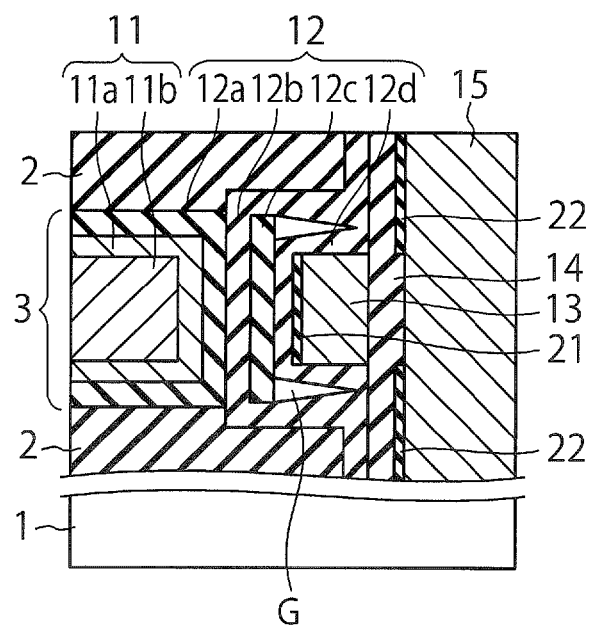

FIGS. 15A and 15B are cross-sectional views illustrating structures of semiconductor devices of other modifications to the second embodiment.

In the modification illustrated in FIG. 15A, a block insulator 12 includes insulators 12a, 12b, 12c and 12d, but does not include an air gap G. The insulator 12c in the present modification has a shape an end of which is pointed. Such a structure can be implemented by oxidizing a portion of the insulator 12c after a process illustrated in FIG. 13B. According to the present modification, when a distance between an upper face and a lower face of a charge storage layer 13 and the insulator 12c is made large, erroneous writing caused by an insulator 12c can be reduced.

In the modification illustrated in FIG. 15B, a portion of an insulator 12c illustrated in FIG. 15A is replaced with an air gap G. Such a structure can be implemented by oxidizing a portion of the insulator 12c after the process illustrated in FIG. 13B and then performing the process illustrated in FIG. 13C. According to the present modification, an advantage of a distance between an upper face and a lower face of a charge storage layer 13 and the air gap G being large can also be enjoyed while the above-described advantage of the air gap G is enjoyed. In FIG. 15B, at least a portion of the insulator contacting a right end of the air gap G and its vicinity may be a portion 14a of a tunnel insulator 14 instead of the insulators 12b and 12b.

As described above, the block insulator 12 in each of the present embodiment and the modifications includes the air gap G in the insulators 12b, 12c, and 12d positioned on the side of the charge storage layer 13. Therefore, according to the present embodiment and the modifications, it is possible to reduce an interference between cells, to reduce a leak current from the cell, and to reduce erroneous writing caused by the insulator 12c.

Third Embodiment

Figure 16:
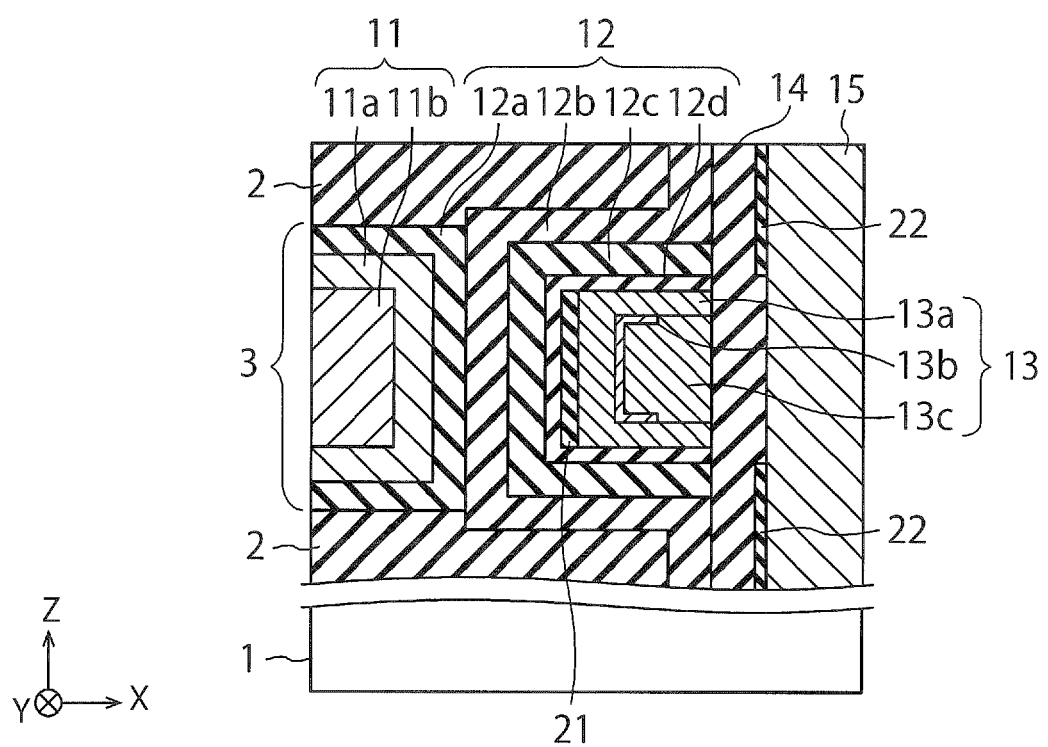
FIG. 16 is a cross-sectional view illustrating a structure of a semiconductor device of a third embodiment.

FIG. 16 is a cross-sectional view illustrating a structure of a semiconductor device of a third embodiment.

The semiconductor device illustrated in FIG. 16 includes silicon nitride films 21 and 22, like the semiconductor device illustrated in FIG. 1. FIG. 16 further illustrates a barrier metal layer 11a, an electrode material layer 11b, and insulators 12c and 12d, described above, and a semiconductor film 13a, a metal film 13b, and a semiconductor film 13c that constitutes a charge storage layer 13.

The semiconductor film 13a is formed on an upper face and a lower face of the insulator 12d and a side face of the silicon nitride film 21. The semiconductor film 13a is a silicon film, for example. The metal film 13b is formed on an upper face, a lower face, and a side face of the semiconductor film 13a. The metal film 13b is a titanium nitride film, for example. The metal film 13b is formed in not the whole but a portion of the upper face and the lower face of the semiconductor film 13a. The semiconductor film 13c is formed on an upper face, a lower face, and a side face of the metal film 13b and the upper face and the lower face of the semiconductor film 13a. The semiconductor film 13c is a silicon film, for example.

The metal film 13b is sandwiched between the semiconductor films 13a and 13c, and is further completely covered with the semiconductor films 13a and 13c. Therefore, the metal film 13b does not contact a tunnel insulator 14.

The charge storage layer 13 in the present embodiment can be formed by forming the semiconductor film 13a, the metal film 13b, and the semiconductor film 13c in this order in a cavity H3 in the process illustrated in FIG. 4B. Before the semiconductor film 13c is formed on the surface of the metal film 13b, a portion of the metal film 13b is removed.

As described above, the charge storage layer 13 in the present embodiment includes not only the semiconductor films 13a and 13c but also the metal film 13b. If the charge storage layer 13 is formed of only a semiconductor, electrons from a channel semiconductor layer 15 may pass through the charge storage layer 13 into the electrode layer 11. However, according to the present embodiment, the metal film 13b can inhibit electrons from passing into the electrode layer 11 by scattering the electrons.

The electrons in the charge storage layer 13 may be accumulated in the semiconductor films 13a and 13c or may be accumulated in the metal film 13b. In the present embodiment, the electrons in the charge storage layer 13 are accumulated in the semiconductor films 13a and 13c.

The metal film 13b in the present embodiment is formed not to contact the tunnel insulator 14. Accordingly, it is possible to improve a window of a memory cell and to suppress a damage to the tunnel insulator 14 from the metal film 13b.

Figure 17A:
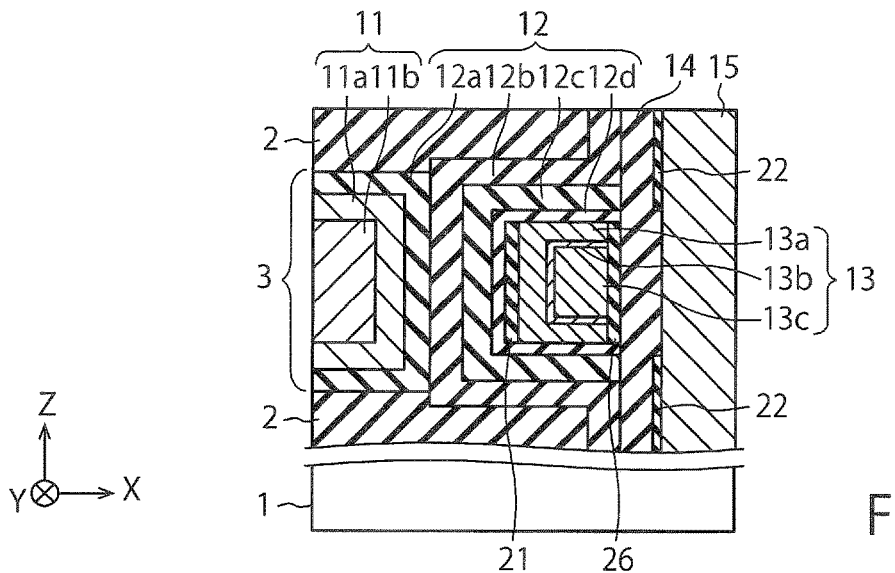
FIGS. 17A to 17C are cross-sectional views illustrating structures of semiconductor devices of modifications to the third embodiment.
Figure 17B:
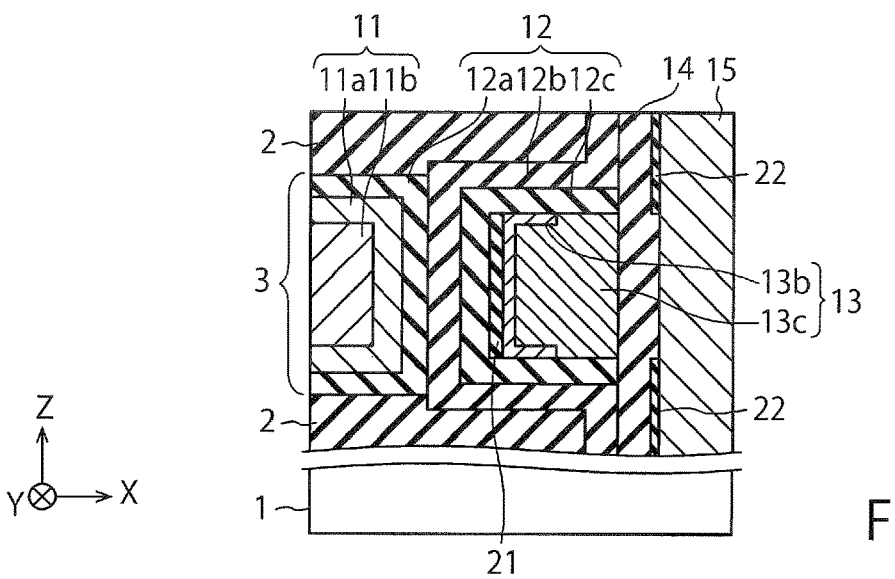
Figure 17C:
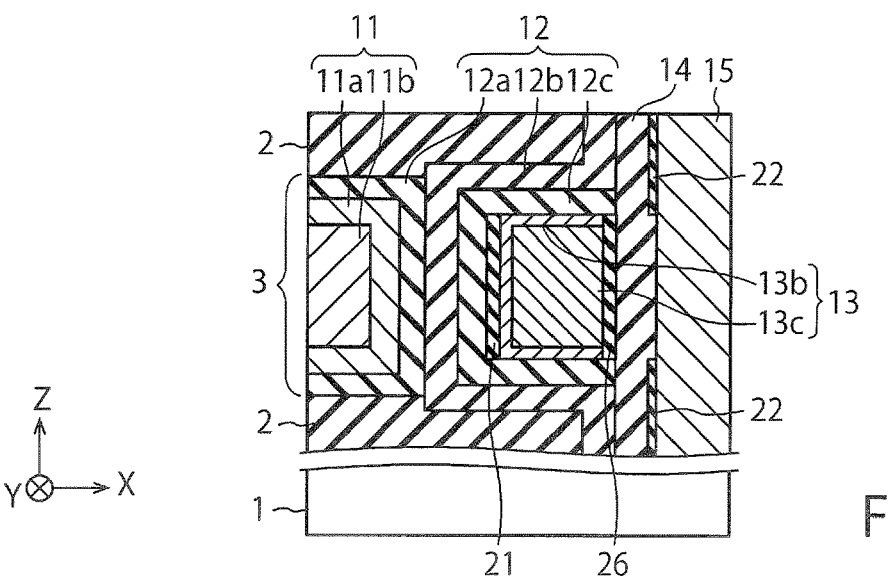

FIGS. 17A to 17C are cross-sectional views illustrating structures of semiconductor devices of modifications to the third embodiment.

In the modification illustrated in FIG. 17A, a metal film 13b is not completely covered with semiconductor films 13a and 13c. However, the semiconductor device of the present modification includes a silicon nitride film 26 between a charge storage layer 13 and a tunnel insulator 14. Therefore, the silicon nitride film 26 prevents contact between the metal film 13b and the tunnel insulator 14. The silicon nitride film 26 can be formed using a similar method to that used to form the silicon nitride film 24b illustrated in FIG. 9C. The metal film 13b in the present modification is formed between the semiconductor film 13a and the semiconductor film 13c and between the semiconductor film 13a and the silicon nitride film 26. The silicon nitride film 26 is an example of a second portion.

In the modification illustrated in FIG. 17B, a semiconductor film 13a is removed from the charge storage layer 13 illustrated in FIG. 16. In the modification illustrated in FIG. 17C, a semiconductor film 13a is removed from the charge storage layer 13 illustrated in FIG. 17A. The charge storage layer 13 may be formed, as in the modifications. In the modifications, a metal film 13b is sandwiched between a semiconductor film 13c and a silicon nitride film 21, for example.

As described above, in the present embodiment and the modifications, the charge storage layer 13 includes the metal film 13b. Therefore, according to the present embodiment and the modifications, electrons can be inhibited from passing through the charge storage layer 13 into the electrode layer 11.

Fourth Embodiment

Figure 18:
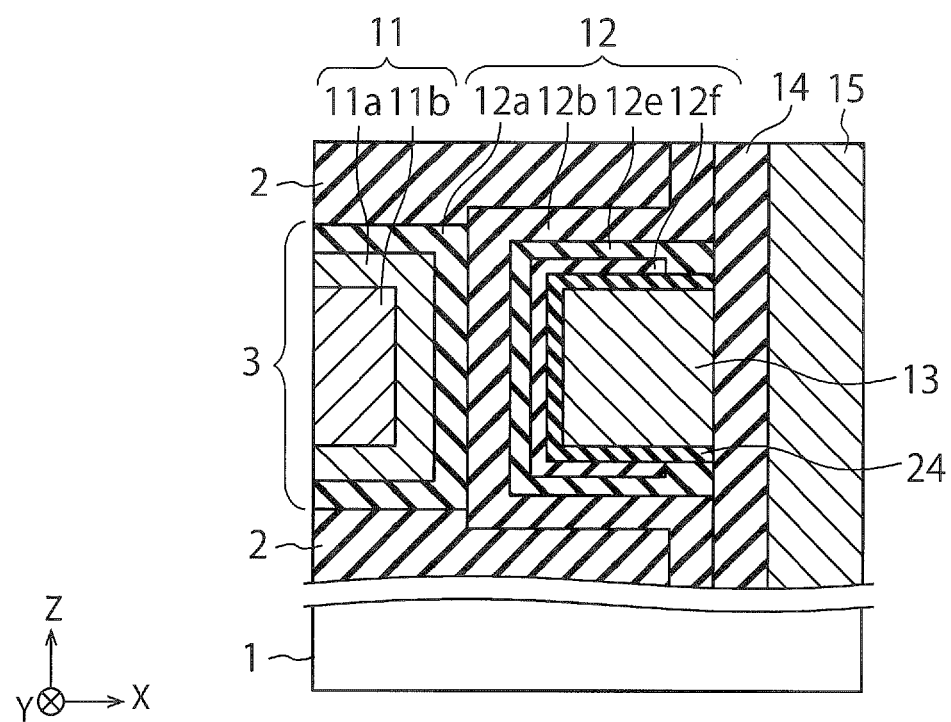
FIG. 18 is a cross-sectional view illustrating a structure of a semiconductor device of a fourth embodiment.

FIG. 18 is a cross-sectional view illustrating a structure of a semiconductor device of a fourth embodiment.

The semiconductor device illustrated in FIG. 18 includes a silicon nitride film 24 (including an insulator 24a but not including an insulator 24b), like the semiconductor device illustrated in FIG. 8. FIG. 18 further illustrates a barrier metal layer 11a and an electrode material layer 11b, described above, and insulators 12e and 12f that, together with insulators 12a and 12b, constitute a block insulator 12.

The block insulator 12 includes the insulator 12a provided on a side face, an upper face, and a lower face of an electrode layer 11, and the insulators 12f, 12e, and 12b that are provided in this order on a side face, an upper face, and a lower face of a charge storage layer 13. The insulator 12a is an aluminum oxide film, for example. The insulator 12b is a silicon oxide film, for example. The insulator 12e is a high-k insulator (high dielectric constant insulator), for example, and specifically is a $HfO_X$ film (or a $HfTiO_X$ film containing a titanium atom at a low composition ratio). The insulator 12f is a high-k insulating layer, for example, and specifically is a $HfTiO_X$ film containing a titanium atom at a high composition ratio. In the present embodiment, the composition ratio of the titanium atom in the insulator 12e is lower than the composition ratio of the titanium atom in the insulator 12f. If the insulator 12e is a $HfO_X$ film, the composition ratio of the titanium atom in the insulator 12e is zero or substantially zero. According to the present embodiment, the block insulator 12 on the side of the charge storage layer 13 includes not only the insulator 12b but also the insulators 12e and 12f so that the performance of the block insulator 12 on the side of the charge storage layer 13 can be improved.

An end of the insulator 12f in the present embodiment is covered with the insulator 12e and the silicon nitride film 24. Therefore, the insulator 12f in the present embodiment does not contact a tunnel insulator 14, like the insulator 12c in the second embodiment. In the present embodiment, the insulator 12e in the vicinity of the end of the insulator 12f is a $HfO_X$ film containing a nitrogen atom.

A result of an experiment has indicated that when the insulators 12e and 12f are each a $HfTiO_X$ film, a trap density in the insulators 12e and 12f more increases than when the insulators 12e and 12f are each a $HfO_X$ film. Accordingly, a writing characteristic and an erasing characteristic of a memory cell can be improved.

The result of the experiment has further indicated that a trap density in the $HfTiO_X$ film increases as the composition ratio of the titanium atom in the $HfTiO_X$ film. The increase in the trap density may increase erroneous writing into the memory cell, although it results in an improvement in the writing characteristic and the erasing characteristic of the memory cell. The block insulator 12 in the present embodiment includes the insulator 12e containing a titanium atom at a low composition ratio and the insulator 12f containing a titanium atom at a high composition ratio, and the insulator 12e prevents contact between the insulator 12f and the tunnel insulator 14. Accordingly, a profit produced by the increase in the trap density can be enjoyed while erroneous writing into the memory cell is suppressed.

The result of the experiment has further indicated that when a nitrogen concentration in each of the $HfO_X$ film and the $HfTiO_X$ film is high, the titanium atom is not easily diffused from the outside to the inside of the films and the titanium atom is easily diffused from the inside to the outside of the films. In the present embodiment, a nitrogen atom is doped into the insulators 12e and 12f in the vicinity of the tunnel insulator 14. Accordingly, a structure in which the end of the insulator 12f is covered with the insulator 12e can be implemented (see FIG. 19C, described below) so that erroneous writing into the memory cell can be effectively suppressed.

A titanium concentration in the insulator 12e is $1.0 \times 10^{20}$ atoms/cm$^3$ or less, for example, at least in the vicinity of the end of the insulator 12f, and a titanium concentration in the insulator 12f is $1.0 \times 10^{20}$ atoms/cm$^3$ or more, for example. Further, a nitrogen concentration in the insulator 12e is $1.0 \times 10^{20}$ atoms/cm$^3$ or more, for example, at least in the vicinity of the end of the insulator 12f, and a nitrogen concentration in the insulator 12f is $1.0 \times 10^{20}$ atoms/cm$^3$ or less, for example. The insulators 12e and 12f in the present embodiment may include an Al atom, a Si atom, or a Zr (zirconium) atom instead of a Hf atom.

Figure 19A:
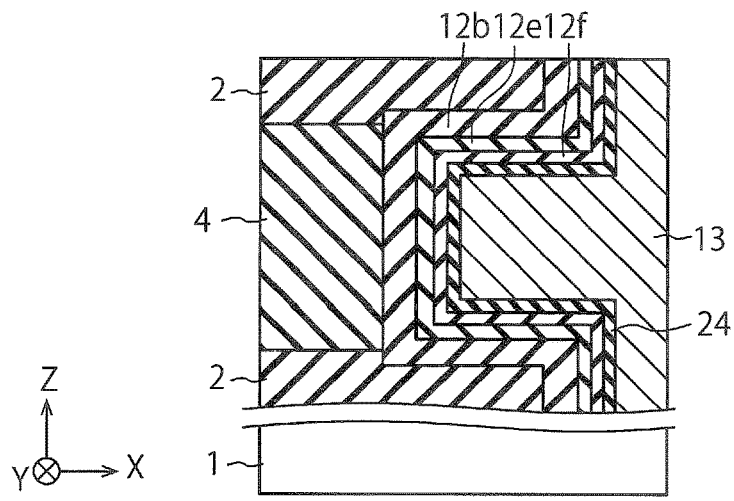
FIGS. 19A to 19C are cross-sectional views illustrating a method of manufacturing the semiconductor device of the fourth embodiment.
Figure 19B:
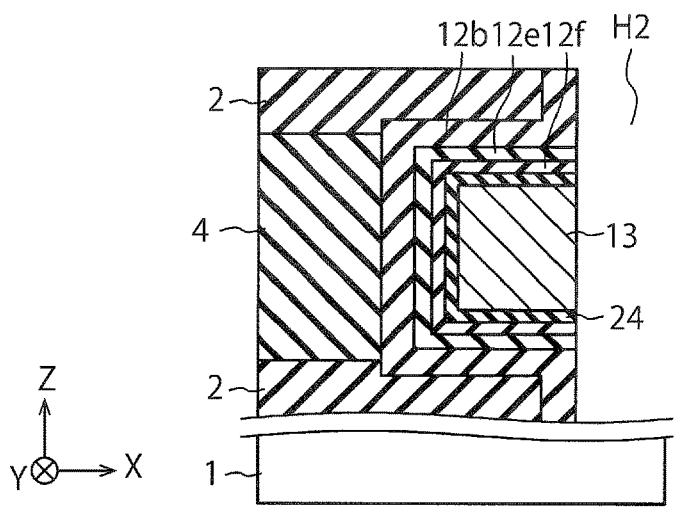
Figure 19C:
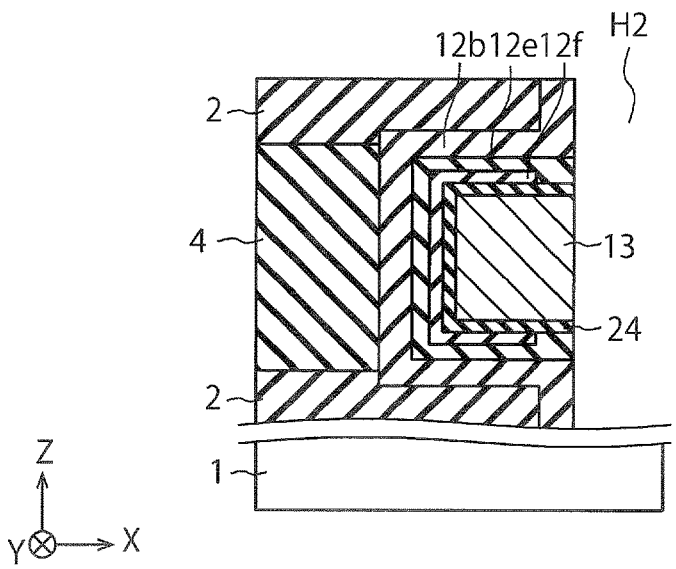

FIGS. 19A to 19C are cross-sectional views illustrating a method of manufacturing the semiconductor device of the fourth embodiment.

First, after the processes illustrated in FIGS. 2A to 4A are performed, insulators 12b, 12e, and 12f, a silicon nitride film 24, and a charge storage layer 13 are formed in this order in a cavity H3, for example (FIG. 19A). The insulator 12e is a HfO$_X$ film, for example, and is formed by ALD using a Hf source gas and O$_3$. After the HfO$_X$ film is formed, a surface of the HfO$_X$ film may be nitride to form a nitride film having a thickness of approximately 1 nm. Such nitriding treatment is performed at a temperature of 300 to 800° C. in a N$_2$ atmosphere by plasma annealing, for example. A N$_2$ gas may be replaced with an NH$_3$ gas. The insulator 12f is a HfTiO$_X$ film, for example, and is formed by ALD using a Hf source gas, a Ti source gas, and O$_3$.

Then, the charge storage layer 13 and the insulators 12f and 12e outside the cavity H3 are removed by wet etching using an alkaline chemical solution (FIG. 19B). As a result, charge storage layers 13 in different cavities H3 are separated from one another.

Then, the insulators 12e and 12f are nitrided from a hole H2, to nitride an end having a thickness of approximately 1 nm of each of the insulators 12e and 12f. Such nitriding treatment is performed at a temperature of 300 to 800° C. in a N$_2$ atmosphere by plasma annealing, for example. A N$_2$ gas may be replaced with an NH$_3$ gas. According to the nitriding treatment, a titanium atom can be diffused outward from the end of each of the insulators 12e and 12f. As a result, both the ends of the insulators 12e and 12f each become a HfO$_X$ film (or a HfTiO$_X$ film containing a titanium atom at a low composition ratio). This corresponds to a change of the end of the insulator 12f to the insulator 12e. Accordingly, the end of the insulator 12f can be moved toward an electrode layer 11 so that a structure in which the end of the insulator 12f is covered with the insulator 12e can be implemented (FIG. 19C).

In the present embodiment, the processes illustrated in FIGS. 4C to 5C are then performed. In such a manner, the semiconductor device of the present embodiment is manufactured.

Figure 20A:
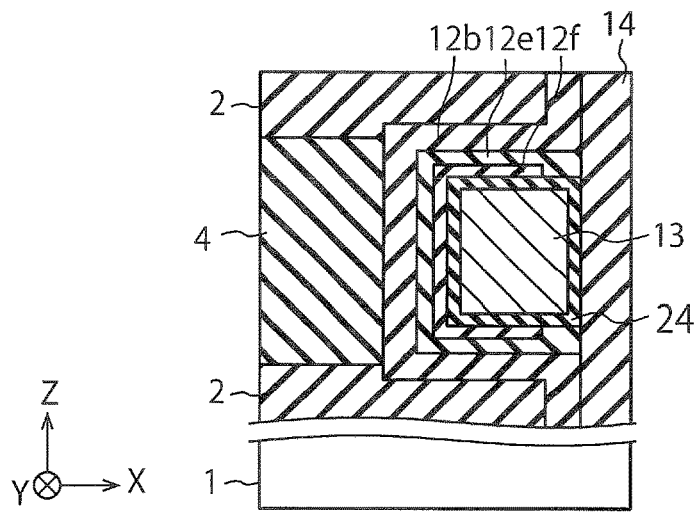
FIGS. 20A to 20C is cross-sectional views illustrating structures of semiconductor devices of modifications to the fourth embodiment.
Figure 20B:
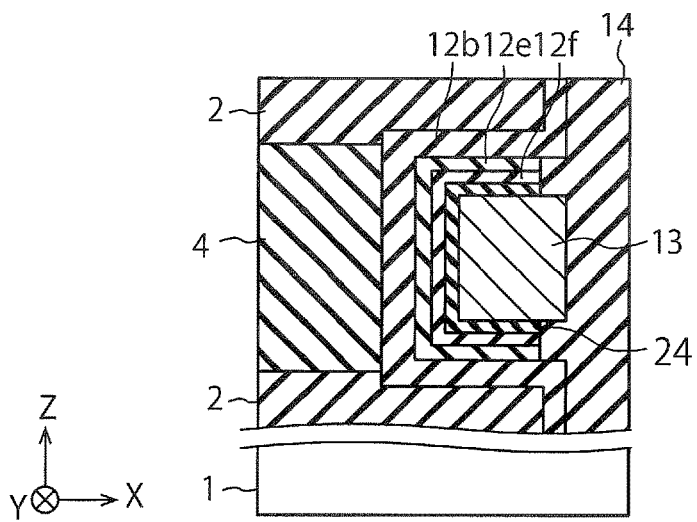
Figure 20C:
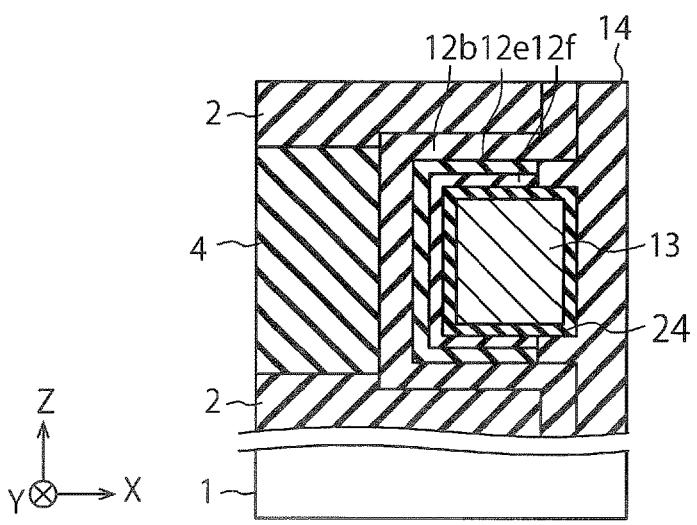

FIGS. 20A to 20C are cross-sectional views illustrating structures of semiconductor devices of modifications to the fourth embodiment.

In the modification illustrated in FIG. 20A, a silicon nitride film 24 is formed on an entire surface of a charge storage layer 13. Such a structure can be implemented by a process for forming an insulator 24a and an insulator 24b, described above.

In the modification illustrated in FIG. 20B, respective ends of insulators 12e and 12f and an end of a silicon nitride film 24 are recessed with respect to a side face of a charge storage layer 13. A tunnel insulator 14 enters a concave portion facing the ends. Such a structure can be implemented by performing a process for recessing the ends by wet etching instead of a process illustrated in FIG. 19C. Such a structure enables erroneous writing into a memory cell to be suppressed, like the structure illustrated in FIG. 18.

In the modification illustrated in FIG. 20C, a silicon nitride film 24 is formed on an entire surface of a charge storage layer 13 while respective ends of insulators 12e and 12f are recessed with respect to a side face of the charge storage layer 13. A tunnel insulator 14 enters a concave portion facing the ends. Such a structure can be implemented by performing a process for recessing the ends by wet etching and a process for forming an insulator 24b instead of the process illustrated in FIG. 19C. Such a structure enables erroneous writing into a memory cell to be suppressed, like the structure illustrated in FIG. 18. In such a recessing process, an end of the silicon nitride film 24 may also be recessed. The insulator 24b is formed in a portion obtained by the recessing.

Figure 21:
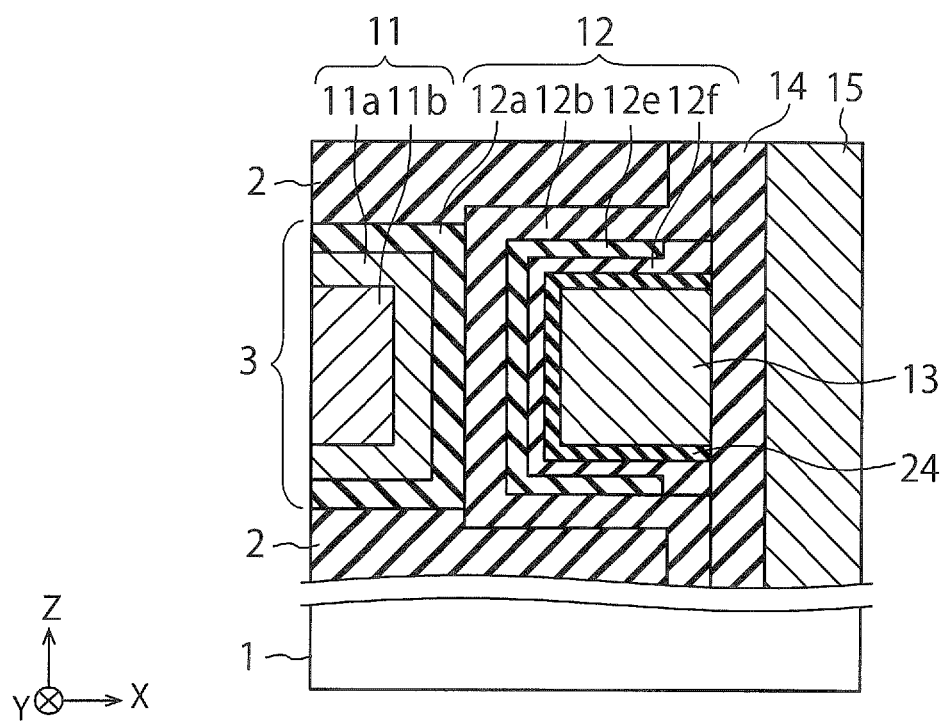
FIG. 21 is a cross-sectional view illustrating a structure of a semiconductor device of another modification to the fourth embodiment.

FIG. 21 is a cross-sectional view illustrating a structure of a semiconductor device of another modification to the fourth embodiment.

In the modification illustrated in FIG. 21, an end of an insulator 12e is covered with an insulator 12f, contrary to the structure illustrated in FIG. 19. Such a structure can be implemented by forming a HfTiO$_X$ film containing a titanium atom at a high composition ratio as the insulator 12e and forming a HfO$_X$ film (or a HfTiO$_X$ film containing a titanium atom at a low composition ratio) as the insulator 12f. According to the present modification, a similar effect to that illustrated in FIG. 19 can be obtained.

According to the present embodiment and the modifications, when the block insulator 12 on the side of the charge storage layer 13 is configured using the HfO$_X$ film and/or the HfTiO$_X$ film, a profit produced by the increase in the trap density can be obtained.

Fifth Embodiment

FIGS. 22A to 23C are cross-sectional views illustrating a method of manufacturing a semiconductor device of a fifth embodiment. In the present embodiment, nitriding treatment using a seam or a bird's beak is handled.

Figure 22A:
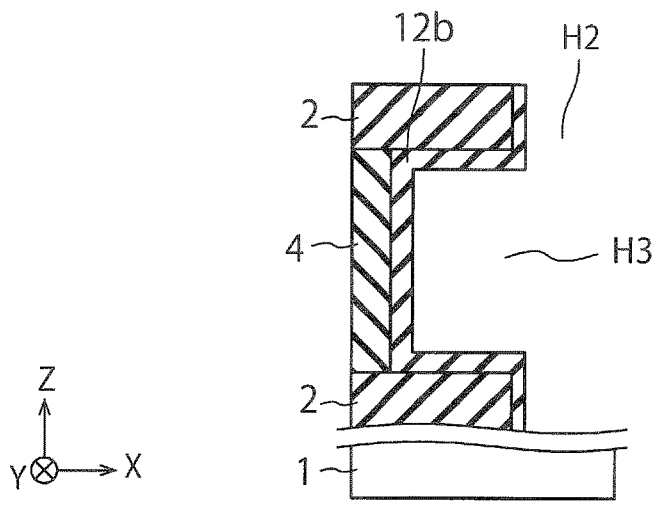
FIGS. 22A to 23C are cross-sectional views illustrating a method of manufacturing a semiconductor device of a fifth embodiment.

First, after the processes illustrated in FIGS. 2A to 4A are performed, an insulator 12b is formed in a cavity H3, for example (FIG. 22A). The insulator 12b is a silicon oxide film having a thickness of 10 nm, for example, and is formed using TDMAS and O$_3$ at a temperature of 400 to 800° C. in a reduced pressure environment (e.g., 2000 Pa or less) by ALD.

Figure 22B:
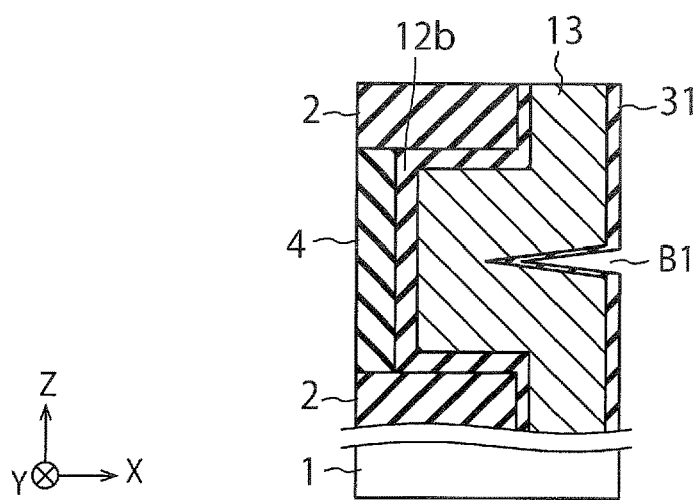

Then, a charge storage layer 13 is formed in the cavity H3, for example (FIG. 22B). The charge storage layer 13 is a silicon layer having a thickness of 10 nm, for example, and is formed using SiH$_4$ at a temperature of 400 to 800° C. in a reduced pressure environment (e.g., 2000 Pa or less) by CVD. FIG. 22B illustrates a seam B1 formed in the charge storage layer 13 in this process and a natural oxide film 31 formed on a surface of the charge storage layer 13.

Figure 22C:
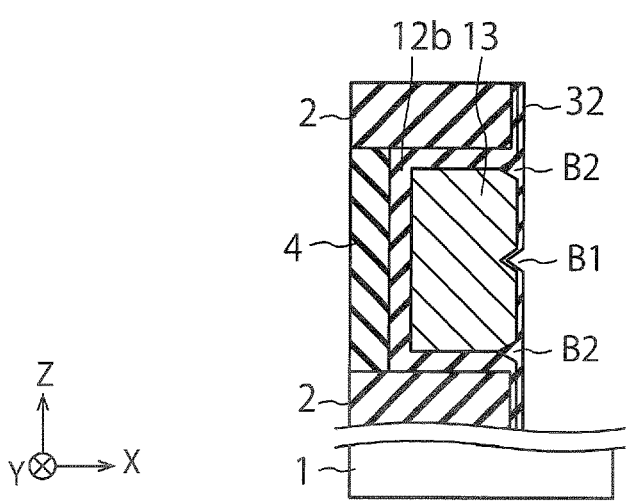

Then, the charge storage layer 13 outside the cavity H3 is removed by wet etching using an alkaline medicinal solution (FIG. 22C). As a result, charge storage layers 13 in different cavities H3 are separated from one another. FIG. 22C illustrates a seam B1 partially cut in this process, a bird's beak B2 formed at a corner of the charge storage layer 13 in this process, and a natural oxide film 32 formed on a surface of the charge storage layer 13, for example.

A process illustrated in FIG. 22C may be performed by dry etching using a $C_XF_Y$ gas (C is carbon and F is fluorine) instead of being performed by wet etching using an alkaline medicinal solution. In this case, fluorine remains on a side face of the charge storage layer 13 after completion of the semiconductor device, and is also diffused to a block insulator 12, a tunnel insulator 14, and a channel semiconductor layer 15 by a post heat process. If a gas for dry etching contains a halogen element other than fluorine, the halogen element can remain on the side face.

Figure 23A:
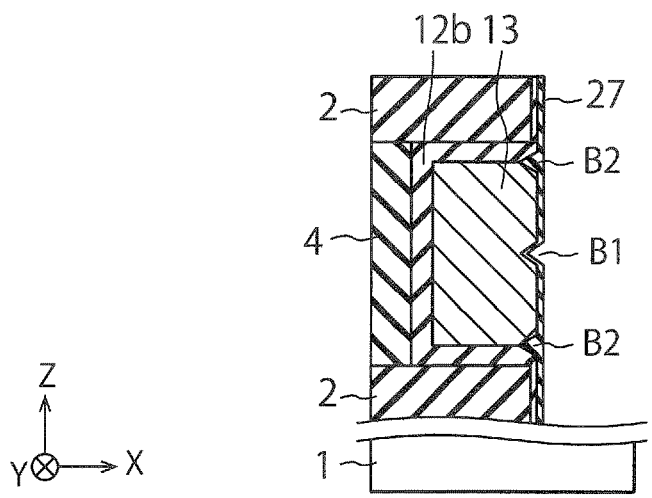

Then, nitriding treatment using a hole H2 is performed (FIG. 23A). As a result, a silicon nitride film 27 is formed on the side face of the charge storage layer 13. The nitriding treatment is performed at a temperature of 500° C. or more by radical nitriding using a nitriding gas (e.g., a $N_2$ gas), for example. Note that the silicon nitride film 27 also enters the seam B1 and the bird's beak B2. With this process, the silicon nitride film 27 including a portion protruding toward the charge storage layer 13 is formed. The silicon nitride film 27 is an example of a second portion and a fourth portion. Note that the silicon nitride film 27 that has entered the bird's beak B2 contacts an upper face or a lower face of the charge storage layer 13, and the silicon nitride film 27 that has entered the seam B1 does not contact the upper face and the lower face of the charge storage layer 13.

In a process illustrated in FIG. 23A, the charge storage layer 13 and the natural oxide film 32 are nitrided. Further, the insulator 12b and insulating layers 2 may be nitrided. Accordingly, a portion formed by nitriding the natural oxide film 32, the insulator 12b, and the insulating layers 2 in the silicon nitride film 27 accurately becomes a silicon oxynitride film. Accordingly, the silicon nitride film 27 may at least partially contain oxygen.

Figure 23B:
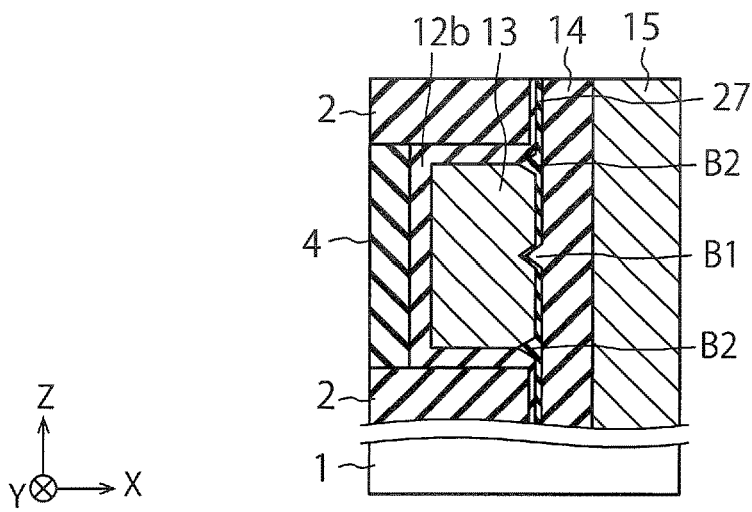
Figure 23C:
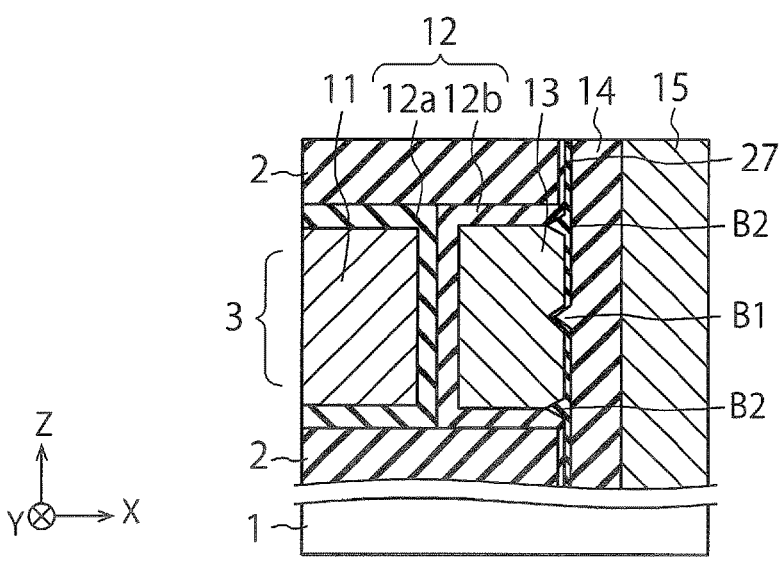

Then, a tunnel insulator 14 and a channel semiconductor layer 15 are formed in this order in each of holes H2, like in the process illustrated in FIG. 4C (FIG. 23B). Then, a remainder of each of sacrifice layers 4 is replaced with an insulator 12a and an electrode layer 11, like in the process illustrated in FIG. 5A and the process illustrated in FIG. 5C (FIG. 23C).

Then, various interconnect layers and inter layer dielectrics are formed on a substrate 1. In such a manner, the semiconductor device of the present embodiment is manufactured.

The silicon nitride film 27 in the present embodiment is formed to a shape similar to that of the above-described silicon nitride film 25. Therefore, according to the present embodiment, when the silicon nitride film 27 is formed, a similar effect to that when the silicon nitride film 25 is formed can be obtained.

In the present embodiment, the silicon nitride film 27 is formed to enter the seam B1 and the bird's beak B2. If the seam B1 and the bird's beak B2 are left covered with the natural oxide film 32, a writing characteristic into a memory cell decreases due to an influence of a damage at respective positions of the seam B1 and the bird's beak B2 and an influence of the natural oxide film 32. However, according to the present embodiment, when the silicon nitride film 27 is formed to enter the seam B1 and the bird's beak B2, the writing characteristic into the memory cell can be made favorable. If fluorine is supplied by thermal diffusion, an interface defect is fluorine terminated so that a writing/erasing cycle stress tolerance is improved. In this case, in the channel semiconductor layer 15, a channel current increases, a threshold value distribution decreases, and a memory cell is easily multivalued, for example, due to the fluorine termination of a grain boundary defect of crystallized silicon and the interface defect between the tunnel insulator 14 and the channel semiconductor layer 15.

Sixth Embodiment

Figure 24:
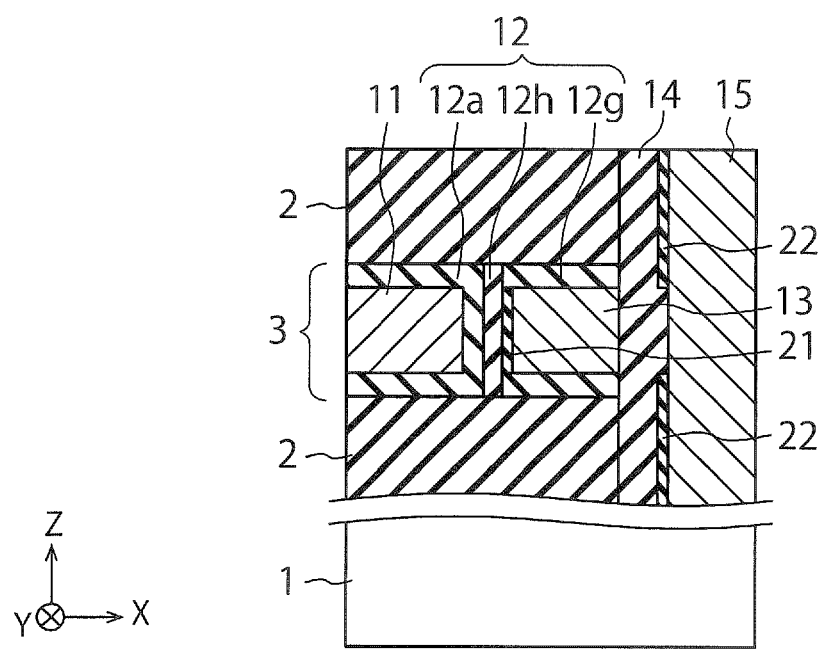
FIG. 24 is a cross-sectional view illustrating a structure of a semiconductor device of a sixth embodiment.

FIG. 24 is a cross-sectional view illustrating a structure of a semiconductor device of a sixth embodiment.

The semiconductor device illustrated in FIG. 24 includes silicon nitride films 21 and 22, like the semiconductor device illustrated in FIG. 1. FIG. 24 further illustrates insulators 12g and 12h that, together with an insulator 12a, constitute a block insulator 12. The insulator 12a is an example of a first layer, and the insulators 12g and 12h are each an example of a second layer.

The block insulator 12 includes the insulator 12a provided on a side face, an upper face, and a lower face of an electrode layer 11, the insulator 12g provided on an upper face and a lower face of a charge storage layer 13, and the insulator 12h provided on a side face of the charge storage layer 13. The insulator 12a is an aluminum oxide film, for example. The insulator 12g is a SiOC film containing a carbon atom at a relatively high composition ratio. The insulator 12h is a $SiO_2$ film (or a SiOC film containing a carbon atom at a relatively low composition ratio), for example. In the present embodiment, a carbon concentration in the insulator 12g is higher than a carbon concentration in the insulator 12h. If the insulator 12h is a $SiO_2$ film, the carbon concentration in the insulator 12h is zero or substantially zero. The carbon concentration in the insulator 12h is $1.0 \times 10^{16}$ atoms/cm$^3$ or less, for example, and the carbon concentration in the insulator 12g is $1.0 \times 10^{16}$ atoms/cm$^3$ or more, for example. The insulator 12h is an example of a first region, and the insulator 12g is an example of a second region.

Figure 25A:
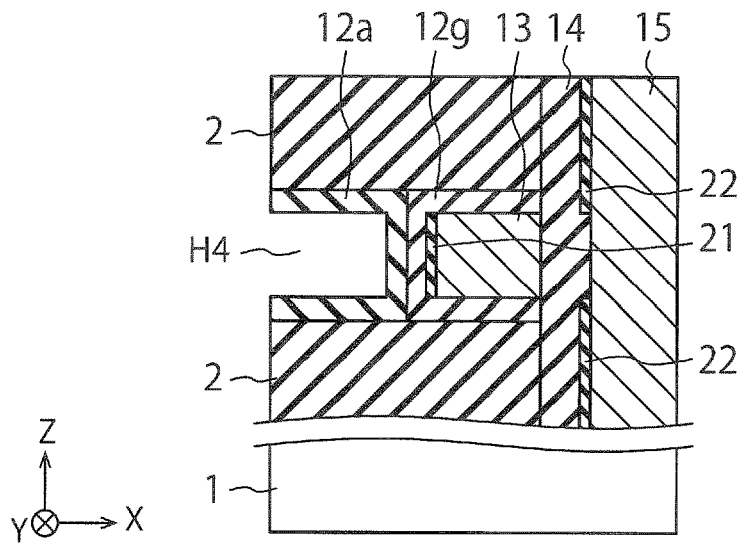
FIGS. 25A to 25C are cross-sectional views illustrating a method of manufacturing the semiconductor device of the sixth embodiment.
Figure 25B:
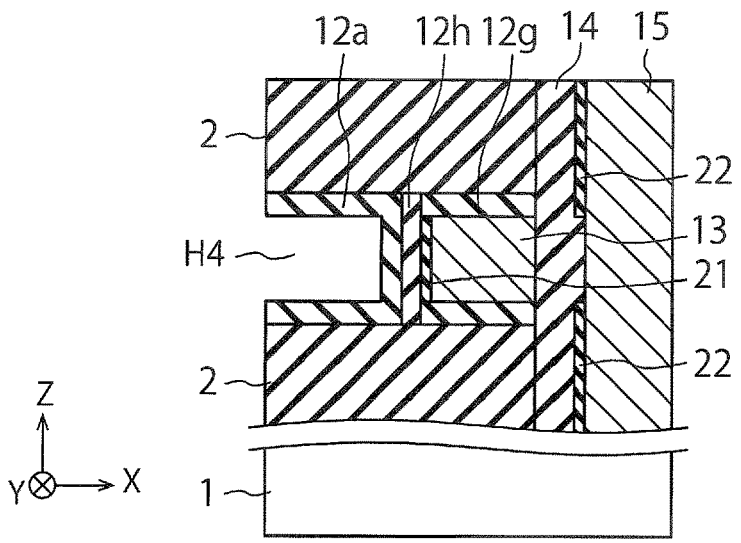
Figure 25C:
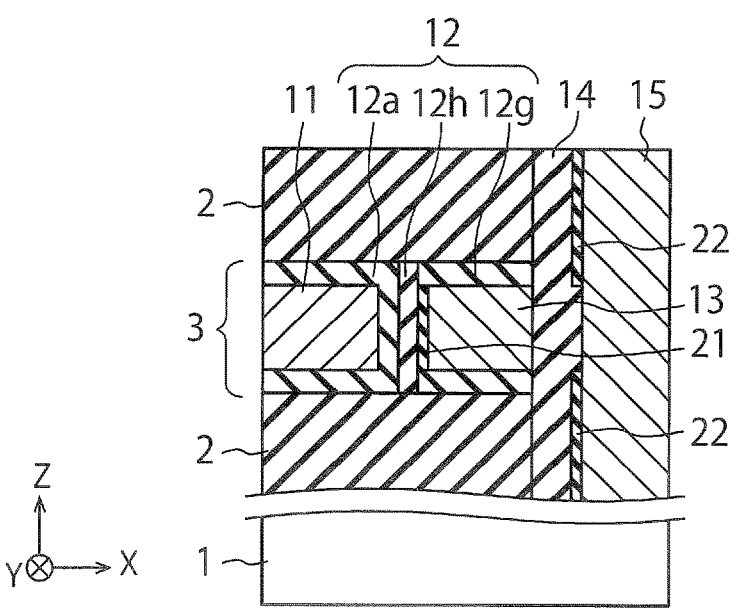

FIGS. 25A to 25C are cross-sectional views illustrating a method of manufacturing the semiconductor device of the sixth embodiment.

First, the processes illustrated in FIGS. 2A to 5A are performed, and an insulator 12a is then formed in a cavity H4 (FIG. 25A), like in the process illustrated in FIG. 5C. In a process illustrated in FIG. 4B in the present embodiment, an insulator 12g is formed instead of the insulator 12b. The insulator 12g is a SiOC film having a thickness of 10 nm. For example, an amorphous SiC film is formed using $SiH_4$, $Si_2H_6$, and $C_2H_6$ at a temperature of 300 to 700° C. in a reduced pressure environment (e.g., 2000 Pa or less) by CVD, and is oxidized using $H_2$ and $O_2$ at a temperature of 500 to 700° C. in a reduced pressure environment (e.g., 2000 Pa or less) by plasma oxidation or thermal oxidation, to form a SiOC film (the insulator 12g) from the SiC film. At least any one of $SiH_2Cl_2$, $Si_2Cl_6$, and $SiCl_4$ may be used instead of $SiH_4$ and/or $Si_2H_6$.

Then, to modify the insulator 12a (the aluminum oxide film), the insulator 12a is annealed in a nitrogen atmosphere at a temperature of 600 to 1200° C. (FIG. 25B). In this case, a carbon atom passes outward through the insulator 12g in the vicinity of the insulator 12a. As a result, the insulator 12g on a side face of a charge storage layer 13 changes to a $SiO_2$ film (or a SiOC film containing a carbon atom at a relatively low composition ratio), i.e., changes to an insulator 12h. On the other hand, the insulator 12g on an upper face and a lower face of the charge storage layer 13 are maintained in a SiOC film containing a carbon atom at a relatively high composition ratio, i.e., maintained in the insulator 12g.

Then, an electrode layer 11 is formed in a cavity H4 (FIG. 25C). The electrode layer 11 includes a titanium nitride film as a barrier metal layer and a tungsten layer as an electrode material layer. The titanium nitride film is formed using TiCl$_4$ and NH$_3$, for example. The tungsten layer is formed using WF$_6$, for example.

Then, various interconnect layers and inter layer dielectrics are formed on a substrate 1. In such a manner, the semiconductor device of the present embodiment is manufactured.

As described above, the block insulator 12 in the present embodiment includes the insulator 12g containing carbon on the upper face and the lower face of the charge storage layer 13. Accordingly, it is possible to suppress a load electric field to a non-selected cell and to reduce erroneous writing to the non-selected cell.

While a specific dielectric constant of the SiO$_2$ film is 3.9, a specific dielectric constant of the SiOC film becomes lower than 3.9. In the present embodiment, when the insulator 12g contains carbon, a specific dielectric constant of the insulator 12g can be decreased to approximately 3.0. Accordingly, erroneous writing into the non-selected cell can be effectively reduced.

Seventh Embodiment

Figure 26:
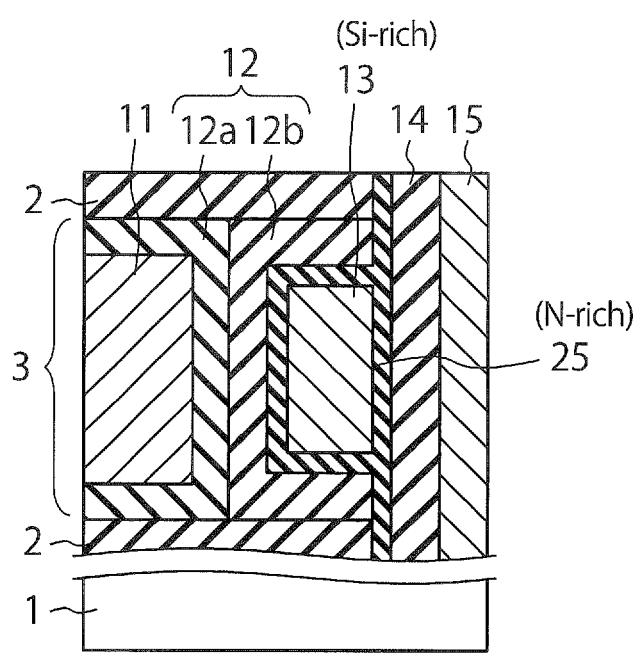
FIG. 26 is a cross-sectional view illustrating a structure of a semiconductor device of a seventh embodiment.

FIG. 26 is a cross-sectional view illustrating a structure of a semiconductor device of a seventh embodiment.

The semiconductor device illustrated in FIG. 26 has a similar structure to that of the semiconductor device illustrated in FIG. 10. In the present embodiment, a charge storage layer 13 is a Si-rich silicon nitride film, and a silicon nitride film 25 is a N-rich silicon nitride film.

Therefore, the silicon nitride film 25 in the present embodiment has a higher composition ratio of nitrogen to silicon and nitrogen than that of the charge storage layer 13. When the silicon nitride film 25 is represented by a composition formula Si$_{1-X}$N$_X$, and the charge storage layer 13 is represented by a composition formula Si$_{1-Y}$N$_Y$, a relationship of X>Y holds. Accordingly, the composition ratio of nitrogen in the silicon nitride film 25 is relatively large, for example, a value of "X/(1−X)" is 1.22 or more (e.g., 1.30). On the other hand, the composition ratio of nitrogen in the charge storage layer 13 is relatively low, for example, a value of "Y/(1−Y)" is 1.22 or less.

The charge storage layer 13 and the silicon nitride film 25 may contain silicon, nitrogen, and further another element. For example, the charge storage layer 13 may contain at least either one of oxygen and carbon.

FIGS. 27A to 28C are cross-sectional views illustrating a method of manufacturing the semiconductor device of the seventh embodiment.

Figure 27A:
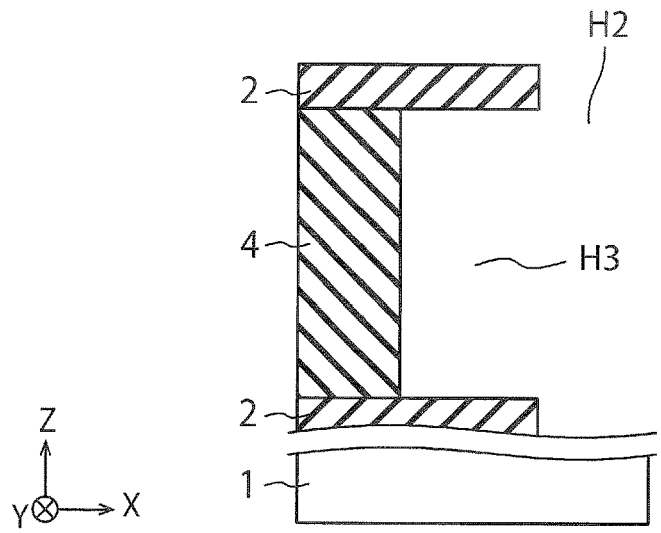
FIGS. 27A to 28C are cross-sectional views illustrating a method of manufacturing the semiconductor device of the seventh embodiment.

First, the processes from FIG. 2A to FIG. 4A are performed. FIG. 27A illustrates the same cross section as that illustrated in FIG. 4A.

Figure 27B:
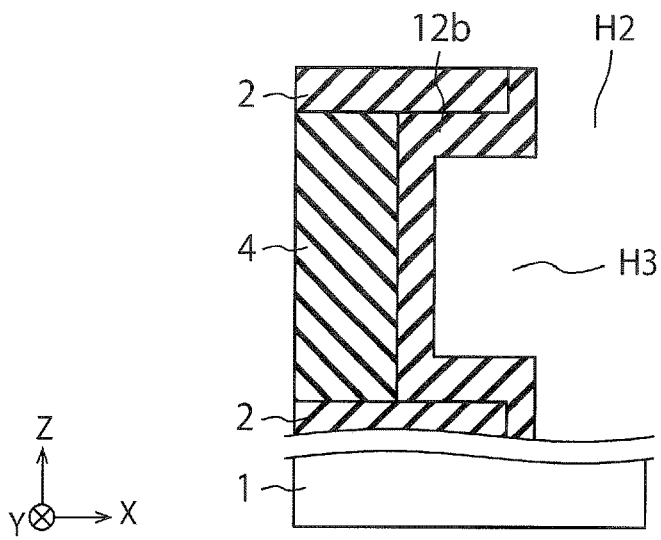

Then, an insulator 12b constituting a block insulator 12 is formed in a cavity H3, for example (FIG. 27B). The insulator 12b is a silicon oxide film having a thickness of 5 to 10 nm, for example, and is formed using TDMAS and O$_3$ at a temperature of 400 to 800° C. in a reduced pressure environment (e.g., 2000 Pa or less) by ALD.

Figure 27C:
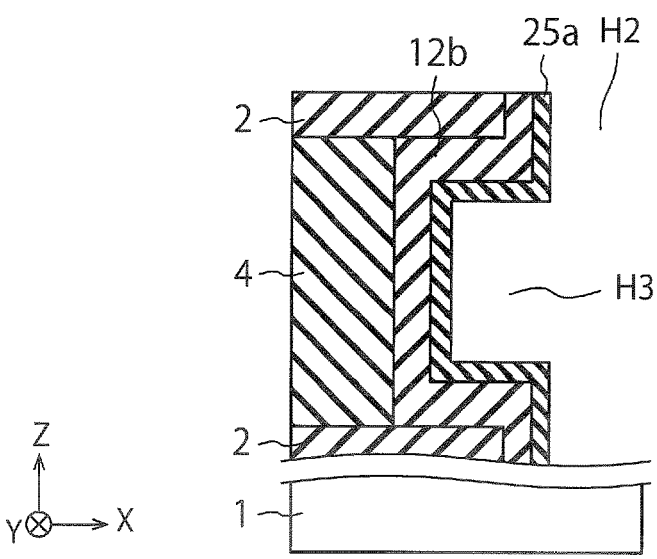

Then, an insulator 25a constituting a silicon nitride film 25 is formed in the cavity H3, for example (FIG. 27C). The insulator 25a is a N-rich silicon nitride film having a thickness of 5 nm, for example, and is formed using SiH$_2$Cl$_2$ and NH$_3$ at a temperature of 300 to 800° C. in a reduced pressure environment (e.g., 2000 Pa or less) by ALD.

Figure 28A:
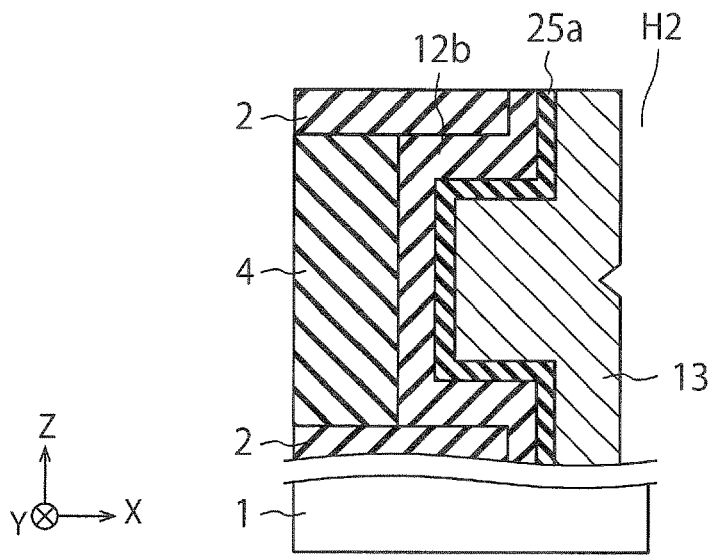

Then, a charge storage layer 13 is formed in the cavity H3, for example (FIG. 28A). The charge storage layer 13 is a Si-rich silicon nitride film having a thickness of 5 to 10 nm, for example, and is formed using SiH$_2$Cl$_2$ and NH$_3$ at a temperature of 300 to 800° C. in a reduced pressure environment (e.g., 2000 Pa or less) by ALD. An amount of supply of SiH$_2$Cl$_2$ when the charge storage layer 13 is formed is controlled such that a composition ratio of nitrogen in the charge storage layer 13 is lower than a composition ratio of nitrogen in the insulator 25a.

Figure 28B:
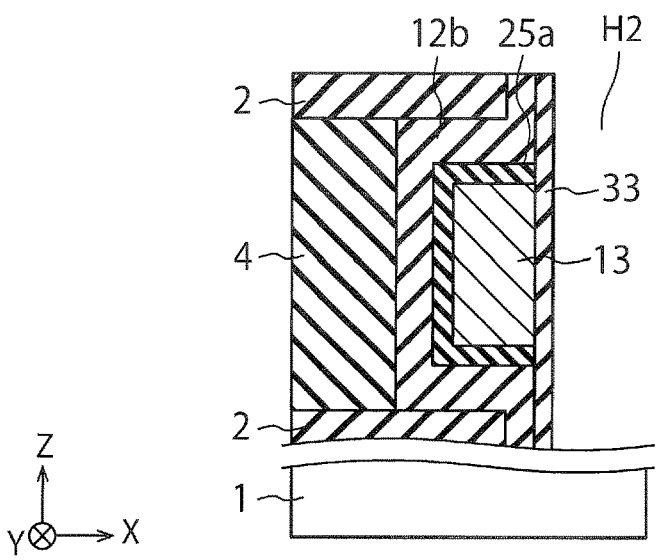

Then, the charge storage layer 13 and the insulator 25a outside the cavity H3 are removed by wet etching using an alkaline medicinal solution (FIG. 28B). As a result, charge storage layers 13 in different cavities H3 are separated from one another. FIG. 28B illustrate a natural oxide film 33 then formed on a surface of the charge storage layer 13, for example.

Figure 28C:
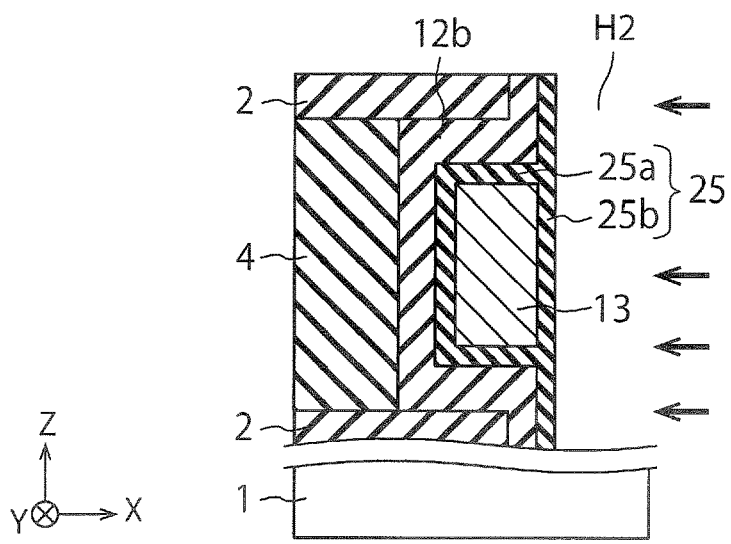

Then, nitriding treatment using a hole H2 is performed (FIG. 28C). As a result, an insulator 25b constituting the silicon nitride film 25 is formed on a surface of the charge storage layer 13, for example. The nitriding treatment is performed by annealing using an NH$_3$ gas, for example. The insulator 25b is a N-rich silicon nitride film, for example.

In a process illustrated in FIG. 28C, the charge storage layer 13 and the natural oxide film 33 are nitrided. Further, the insulator 12b and insulating layers 2 may be nitrided. Accordingly, a portion, formed by nitriding the natural oxide film 33, the insulator 12b, and the insulating layers 2, in the insulator 25b accurately becomes a silicon oxynitride film. Accordingly, the insulator 25b may at least partially contain oxygen.

In the present embodiment, the processes illustrated in FIGS. 4C, 5A and 5C are then performed. In such a manner, the semiconductor device of the present embodiment is manufactured.

As described above, the charge storage layer 13 in the present embodiment is a Si-rich silicon nitride film, and is covered with the Ni-rich silicon nitride film (the silicon nitride film 25). Therefore, according to the present embodiment, it is possible to store charges in the Si-rich silicon nitride film and for the N-rich silicon nitride film to prevent the charges from passing through the Si-rich silicon nitride film. Therefore, according to the present embodiment, it is possible to control a flow of carriers with high accuracy and thereby to suppress problems such as erroneous writing into a non-selected cell.

Figure 29A:
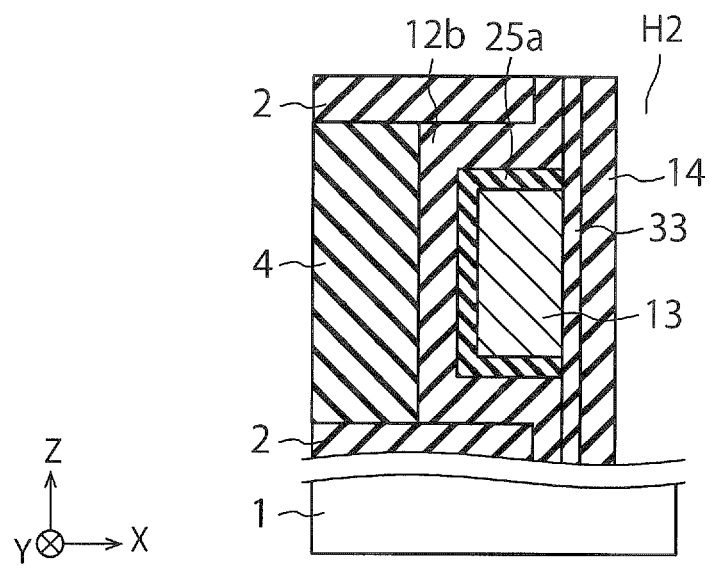
FIGS. 29A and 29B are cross-sectional views illustrating a method of manufacturing a semiconductor device of a first modification to the seventh embodiment.
Figure 29B:
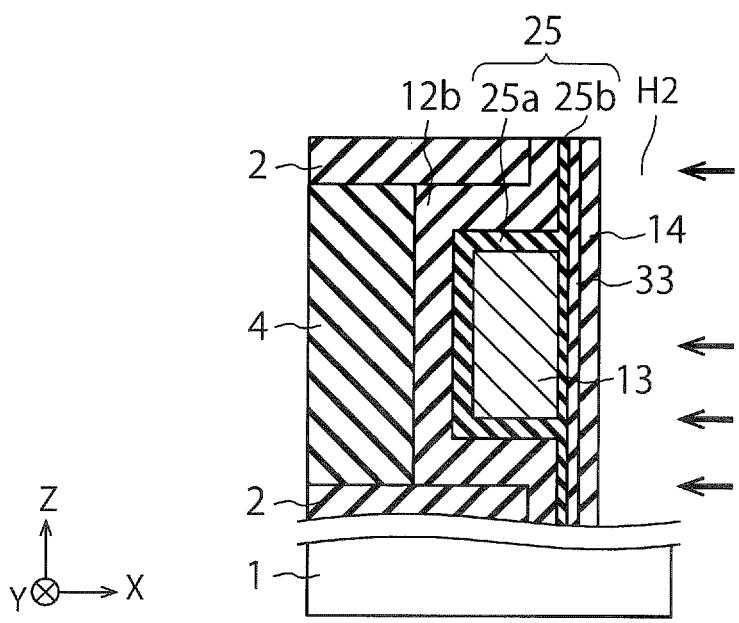

FIGS. 29A and 29B are cross-sectional views illustrating a method of manufacturing a semiconductor device of a first modification to the seventh embodiment.

In the present modification, processes illustrated in FIGS. 29A and 29B are performed instead of the process illustrated in FIG. 28C. In the process illustrated in FIG. 29A, a tunnel insulator 14 is formed on a side face of a natural oxide film 33. The tunnel insulator 14 is a silicon oxide film, for example.

Then, annealing treatment using a NO gas is performed (FIG. 29B). As a result, a side face, on the side of a charge storage layer 13, of the natural oxide film 33 is nitrided, to form an insulator 25b. The insulator 25b is a N-rich silicon nitride film, for example. Then, after a channel semiconductor layer 15 is formed, the processes illustrated in FIGS. 5A and 5C are performed, to complete the semiconductor device.

Figure 30A:
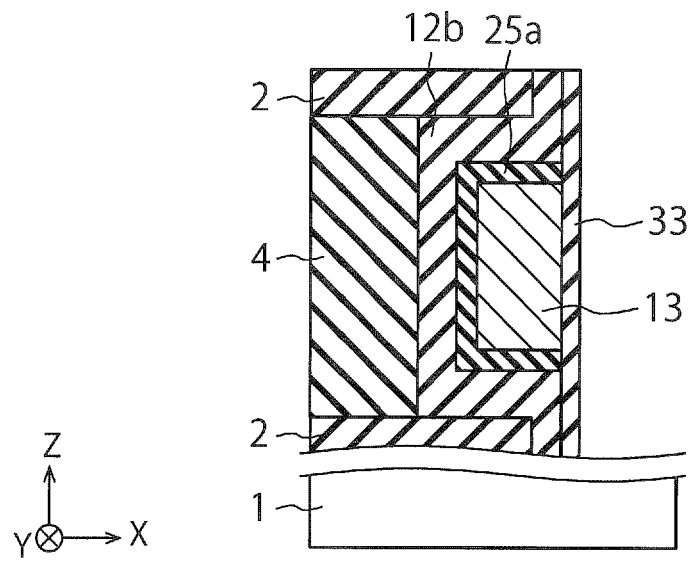
FIGS. 30A and 30B are cross-sectional views illustrating a method of manufacturing a semiconductor device of a second modification to the seventh embodiment.
Figure 30B:
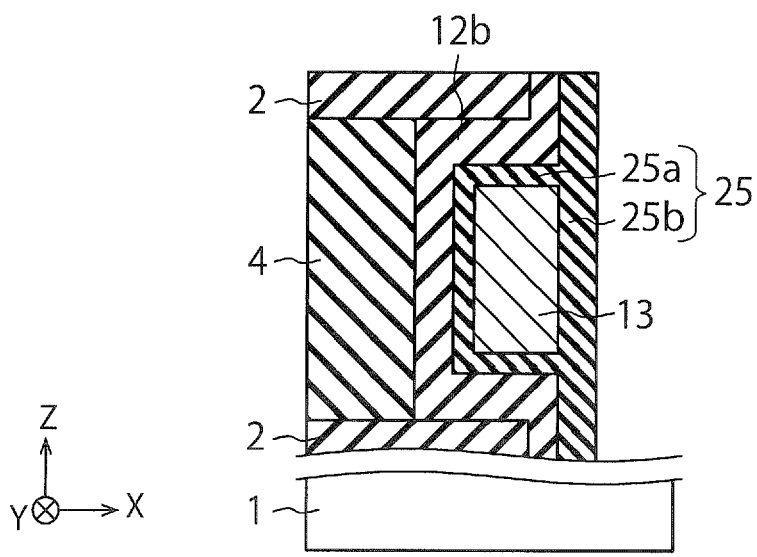

FIGS. 30A and 30B are cross-sectional views illustrating a method of manufacturing a semiconductor device of a second modification to the seventh embodiment.

FIG. 30A illustrates the same cross section as that illustrated in FIG. 28B. In the present modification, a process illustrated in FIG. 30B is performed instead of the process illustrated in FIG. 28C. In the process illustrated in FIG.

30B, a N-rich SiN film (or a SiON film) is formed on a surface of a natural oxide film 33 by ALD. Accordingly, an insulator 25b including the natural oxide film 33 and the SiN film is formed. During and after ALD, a nitrogen atom may be incorporated into the natural oxide film 33. Then, after a channel semiconductor layer 15 is formed, the processes illustrated in FIGS. 5A and 5C are performed, to complete the semiconductor device.

As described above, in the present embodiment and the modifications, the charge storage layer 13 is the Si-rich silicon nitride film, and is covered with the N-rich silicon nitride film (the silicon nitride film 25). Therefore, according to the present embodiment and the modifications, it is possible to control a flow of carriers with high accuracy and thereby to suppress problems such as erroneous writing into a non-selected cell, like in the first embodiment, for example.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   a plurality of insulating films and a plurality of first films alternately stacked on the substrate, at least one of the first films including an electrode layer and a charge storage layer provided on a face of the electrode layer via a first insulator, the face of the electrode layer being parallel to a direction of the stacking; and
   a semiconductor layer provided on a face of the charge storage layer via a second insulator, the face of the charge storage layer being parallel to the direction of the stacking,
   the device further comprising at least one of:
   a first portion including nitrogen and provided at least between the first insulator and the charge storage layer with an air gap provided in the first insulator,
   a second portion including nitrogen, provided at least between the charge storage layer and the second insulator, and including a portion protruding toward the charge storage layer, and
   a third portion including nitrogen and provided at least between the second insulator and the semiconductor layer with an air gap provided in the first insulator.

2. The device of claim 1, wherein the first portion is provided on the face of the charge storage layer, the face being parallel to the direction of the stacking.

3. The device of claim 1, wherein the second insulator is provided on a face of one of the plurality of insulating films, the face of one of the plurality of insulating films being parallel to the direction of the stacking,
   the device further comprising a fourth portion including nitrogen and provided between one of the plurality of insulating films and the second insulator.

4. The device of claim 1, wherein the second portion includes the portion protruding toward the charge storage layer at a position where the portion protruding toward the charge storage layer does not contact an upper face and a lower face of the charge storage layer.

5. The device of claim 1, wherein the second portion includes the portion protruding toward the charge storage layer at a position where the portion protruding toward the charge storage layer contacts an upper face or a lower face of the charge storage layer.

6. The device of claim 1, wherein the third portion is divided into an upper portion and a lower portion in the direction of the stacking.

7. The device of claim 1, wherein at least one of the first, second and third portions is an insulator including nitrogen.

8. The device of claim 1, wherein
   the first insulator includes a first layer provided on a face of the electrode layer and a second layer provided on a face of the first layer, the face of the electrode layer opposing the charge storage layer, the face of the first layer opposing the charge storage layer,
   the first layer is further provided on an upper face and a lower face of the electrode layer, and
   the second layer is further provided on an upper face and a lower face of the charge storage layer.

9. The device of claim 8, wherein the second layer includes a high-dielectric constant insulator.

10. The device of claim 9, wherein the second layer further includes an insulator including silicon, and the high-dielectric constant insulator is sandwiched between a portion of the insulator including silicon and another portion of the insulator including silicon.

11. The device of claim 8, wherein the air gap is provided in the second layer.

12. The device of claim 1, wherein the charge storage layer includes at least one of a metal film and a semiconductor film.

13. A method of manufacturing a semiconductor device, comprising:
   alternately stacking a plurality of insulating films and a plurality of second films on a substrate;
   forming a hole in the plurality of insulating films and the plurality of second films;
   removing a portion of a second film to recess the second film compared to the insulating films as viewed in a direction that is parallel to a direction of the stacking to form a first concave portion, and forming a charge storage layer on a face of the second film in the first concave portion via a first insulator, the face of the second film in the first concave portion being parallel to the direction of the stacking;
   forming a semiconductor layer on a face of the charge storage layer via a second insulator, the face of the charge storage layer being parallel to the direction of the stacking; and
   removing another portion of the second film to recess the second film compared to the insulating films as viewed in the direction that is parallel to the direction of the stacking to form a second concave portion, and forming an electrode layer on a face of the charge storage layer in the second concave portion via the first insulator, the face of the charge storage layer in the second concave portion being parallel to the direction of the stacking,
   the method further comprising forming at least one of:
   a first portion including nitrogen and provided at least between the first insulator and the charge storage layer with an air gap provided in the first insulator,
   a second portion including nitrogen, provided at least between the charge storage layer and the second insulator, and including a portion protruding toward the charge storage layer, and a third portion including nitrogen and provided at least between the second insulator and the semiconductor layer with an air gap provided in the first insulator.

14. The method of claim 13, wherein the first portion is formed between the first insulator and the charge storage layer after the charge storage layer is formed and before the electrode layer is formed.

15. The method of claim 13, wherein the second portion is formed on the face of the charge storage layer after the charge storage layer is formed and before the semiconductor layer is formed, the face of the charge storage layer being parallel to the direction of the stacking.

16. The method of claim 13, wherein the second portion is formed to include a portion protruding toward the charge storage layer at a position where the portion protruding toward the charge storage layer does not contact an upper face and a lower face of the charge storage layer.

17. The method of claim 13, wherein the second portion is formed to include a portion protruding toward the charge storage layer at a position where the portion protruding toward the charge storage layer contacts an upper face or a lower face of the charge storage layer.

18. The method of claim 13, wherein the third portion is formed between the second insulator and the semiconductor layer after the charge storage layer is formed and before the electrode layer is formed.

19. The method of claim 13, wherein
the first insulator is formed to include a first layer formed on a face of the electrode layer and a second layer formed on a face of the first layer, the face of the electrode layer opposing the charge storage layer, the face of the first layer opposing the charge storage layer,
the first layer is further formed on an upper face and a lower face of the electrode layer, and
the second layer is further formed on an upper face and a lower face of the charge storage layer.

20. The method of claim 19, wherein the air gap is formed in the second layer.

* * * * *